(12) United States Patent
Koyanagi et al.

(10) Patent No.: US 11,895,854 B2
(45) Date of Patent: Feb. 6, 2024

(54) IMAGING DEVICE

(71) Applicant: Panasonic Intellectual Property Management Co., Ltd., Osaka (JP)

(72) Inventors: Takahiro Koyanagi, Osaka (JP); Yuuko Tomekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 33 days.

(21) Appl. No.: 17/809,040

(22) Filed: Jun. 27, 2022

(65) Prior Publication Data
US 2022/0336534 A1 Oct. 20, 2022

Related U.S. Application Data

(63) Continuation of application No. PCT/JP2020/047086, filed on Dec. 17, 2020.

(30) Foreign Application Priority Data

Jan. 23, 2020 (JP) ................................. 2020-009139

(51) Int. Cl.
*H10K 39/32* (2023.01)
*H01L 27/146* (2006.01)

(52) U.S. Cl.
CPC ....... *H10K 39/32* (2023.02); *H01L 27/14665* (2013.01)

(58) Field of Classification Search
CPC .... H10K 39/32; H10K 39/501; H10K 39/601; H01L 27/14665
See application file for complete search history.

(56) References Cited

U.S. PATENT DOCUMENTS

2007/0291144 A1 12/2007 Suzuki
2011/0216212 A1 9/2011 Watanabe et al.
(Continued)

FOREIGN PATENT DOCUMENTS

JP 58-223971 12/1983
JP 11-087683 3/1999
(Continued)

OTHER PUBLICATIONS

International Search Report of PCT application No. PCT/JP2020/047086 dated Mar. 16, 2021.

*Primary Examiner* — Robert G Bachner
*Assistant Examiner* — Molly K Reida
(74) *Attorney, Agent, or Firm* — Rimon P.C.

(57) ABSTRACT

An imaging device includes at least one first pixel electrode, at least one second pixel electrode, a photoelectric converter continuously covering upper surfaces of the at least one first pixel electrode and the at least one second pixel electrode, a first counter electrode facing the at least one first pixel electrode, a second counter electrode facing the at least one second pixel electrode, and a sealing layer continuously covering upper surfaces of the first and second counter electrodes. In a plan view, a first portion of an upper surface of the photoelectric converter in an interelectrode region between the first counter electrode and the second counter electrode is more depressed than a second portion of the upper surface of the photoelectric converter in an overlap region overlapping the first counter electrode or the second counter electrode. The sealing layer is in contact with the photoelectric converter in the interelectrode region.

20 Claims, 8 Drawing Sheets

(56) References Cited

U.S. PATENT DOCUMENTS

2016/0043144 A1* 2/2016 Sato ................. H01L 27/14636
    257/40
2018/0227525 A1   8/2018 Shishido et al.
2018/0277604 A1   9/2018 Joei

FOREIGN PATENT DOCUMENTS

| JP | 2007-336282 | 12/2007 |
|----|-------------|---------|
| JP | 2011-187544 | 9/2011 |
| JP | 2014-067768 | 4/2014 |
| JP | 2019-054499 | 4/2019 |
| WO | 2017/061176 | 4/2017 |

* cited by examiner

IMAGING DEVICE

BACKGROUND

1. Technical Field

The present disclosure relates to an imaging device.

2. Description of the Related Art

For an imaging device such as a CMOS (complementary metal-oxide semiconductor) image sensor, a structure has been proposed in which a photoelectric conversion film formed of an organic material is utilized as a photoelectric converter. For example, regarding a photoelectric conversion element configured such that a photoelectric conversion film is sandwiched between an upper electrode and a lower electrode, Japanese Patent No. 5533046 discloses forming upper electrodes separately for each of pixels by patterning. Japanese Patent No. 5533046 thereby discloses reducing a dark current by applying voltages separately to each of the respective upper electrodes of the pixels.

Further, Japanese Unexamined Patent Application Publication No. 2019-54499 discloses a technique for rendering the sensitivity of each pixel variable by applying individual voltages to upper electrodes electrically separated from one another among pixels. Further, Japanese Patent No. 5946132 discloses forming a photoelectric conversion film by patterning with a first shadow mask and then forming an ITO (indium tin oxide) electrode by patterning with a second shadow mask.

SUMMARY

In one general aspect, the techniques disclosed here feature an imaging device including at least one first pixel electrode, at least one second pixel electrode spaced from the at least one first pixel electrode, a photoelectric converter continuously covering an upper surface of the at least one first pixel electrode and an upper surface of the at least one second pixel electrode, the photoelectric converter including a photoelectric conversion layer, a first counter electrode located above the photoelectric converter, the first counter electrode facing the at least one first pixel electrode, a second counter electrode located above the photoelectric converter and electrically separated from the first counter electrode, the second counter electrode facing the at least one second pixel electrode, and a sealing layer continuously covering an upper surface of the first counter electrode and an upper surface of the second counter electrode, the sealing layer containing an oxide of metal or a nitride of metal. A first portion of an upper surface of the photoelectric converter in an interelectrode region between the first counter electrode and the second counter electrode in plan view is more depressed than a second portion of the upper surface of the photoelectric converter in an overlap region overlapping the first counter electrode or the second counter electrode in plan view. The sealing layer is in contact with the photoelectric converter in the interelectrode region.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
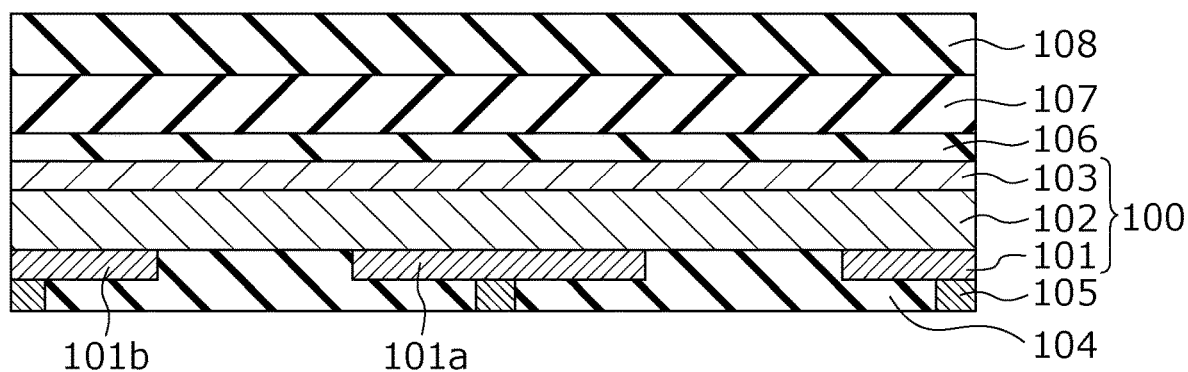
FIG. 1 is a cross-sectional view showing a photodetector according to Comparative Example 1.

An increase in the number of pixels of an imaging device results in an increase in area of an upper electrode. This causes a voltage drop across the upper electrode, and shading may occur due to in-plane variations in potential of the upper electrode. In this case too, the in-plane variations in potential of the upper electrode may be reduced by patterning the upper electrode either for each row or column of pixels or for each pixel. In this way, patterning an upper electrode of a photoelectric conversion element is effective in bringing about improvement in characteristic of an imaging element.

However, in a case where a shadow mask is used as disclosed in Japanese Patent No. 5946132, contamination having adhered to a shadow mask when the shadow mask replaced an old shadow mask undesirably adheres to a surface of the photoelectric conversion layer and reduces the yield of elements. Furthermore, the size of small pixels of the order of microns that are used in an imaging element makes shadow mask patterning difficult.

For this reason, in a case where a counter electrode stacked over a photoelectric conversion film is finely patterned, patterning based on an etching process that is used in the field of semiconductors is preferred. However, in a case where a portion of the counter electrode located above a space between adjacent pixel electrodes has been removed by etching, a portion of the photoelectric conversion film exposed by the portion of the counter electrode being removed has its surface damaged by etching or adsorbs moisture, impurities, or other matter due to atmospheric exposure after the process. This undesirably causes a leak current between adjacent counter electrodes to be produced through the surface of the portion of the photoelectric conversion film.

The present disclosure makes it possible to provide an imaging device with a reduced leak current between adjacent counter electrodes.

BRIEF OVERVIEW OF THE PRESENT DISCLOSURE

In one general aspect, the techniques disclosed here feature an imaging device including at least one first pixel electrode, at least one second pixel electrode spaced from the at least one first pixel electrode, a photoelectric converter continuously covering an upper surface of the at least one first pixel electrode and an upper surface of the at least one second pixel electrode, the photoelectric converter including a photoelectric conversion layer, a first counter electrode located above the photoelectric converter, the first counter electrode facing the at least one first pixel electrode, a second counter electrode located above the photoelectric converter and electrically separated from the first counter electrode, the second counter electrode facing the at least one second pixel electrode, and a sealing layer continuously covering an upper surface of the first counter electrode and an upper surface of the second counter electrode, the sealing layer containing an oxide of metal or a nitride of metal. A first portion of an upper surface of the photoelectric converter in an interelectrode region between the first counter electrode and the second counter electrode in plan view is more depressed than a second portion of the upper surface of the photoelectric converter in an overlap region overlapping the first counter electrode or the second counter electrode in plan view. The sealing layer is in contact with the photoelectric converter in the interelectrode region.

In this way, since the upper surface of the portion of the photoelectric converter in the interelectrode region is depressed, a leak current that flows between the counter electrodes is reduced. This makes it possible to provide an imaging device with a reduced leak current between adjacent counter electrodes.

Further, since the sealing layer can prevent oxygen, moisture, or other matter from arriving at the photoelectric conversion layer from outside, deterioration of a photoelectric conversion function can be reduced.

Further, for example, a thickness of a portion of the photoelectric converter in the interelectrode region may be smaller than a thickness of a portion of the photoelectric converter in the overlap region.

In this way, by making the film thickness of the portion of the photoelectric converter in the interelectrode region smaller, the upper surface of the portion of the photoelectric converter in the interelectrode region can be easily made depressed. For example, by forming a highly membranous photoelectric converter with a uniform thickness over a flat upper surface of an interlayer insulating layer or other layers and then partially removing a surface part of the photoelectric converter, the upper surface of the portion of the photoelectric converter in the interelectrode region can be easily made depressed. This makes it possible to reduce a leak current between adjacent counter electrodes while allowing the photoelectric converter to effectively fulfill its function.

Further, for example, a thickness of a portion of the photoelectric conversion layer in the interelectrode region may be smaller than a thickness of a portion of the photoelectric conversion layer in the overlap region.

In this way, for example, by forming a highly membranous photoelectric conversion layer with a uniform thickness and then partially removing a surface part of the photoelectric conversion layer, the upper surface of the portion of the photoelectric converter in the interelectrode region can be easily made depressed. This makes it possible to reduce a leak current between adjacent counter electrodes while enhancing the photoelectric conversion function.

Further, for example, a distance between the first counter electrode and the second counter electrode may be shorter than a distance between the at least one first pixel electrode and the at least one second pixel electrode.

In this way, a photoelectric conversion region in which a counter electrode and a pixel electrode overlap each other and in which photoelectric conversion is performed can be separated from an end of the counter electrode. This makes it possible to prevent etching damage from being extended to the photoelectric conversion region, making it possible to reduce deterioration of the photoelectric conversion function.

Further, for example, the first counter electrode may have an end face having a forward tapered shape or a shape perpendicular to the upper surface of the first counter electrode, and the second counter electrode may have an end face having a forward tapered shape or a shape perpendicular to the upper surface of the second counter electrode.

An end face formed in a forward tapered shape makes it harder for etching damage by etching gas, oxygen, moisture, or other matter to be extended to the photoelectric conversion region than does an end face formed in a reverse tapered shape. This makes it possible to reduce deterioration of the photoelectric conversion function.

Further, for example, the photoelectric converter may further include an auxiliary layer located between the photoelectric conversion layer and the first counter electrode and between the photoelectric conversion layer and the second counter electrode, and a portion of the auxiliary layer that overlaps the first counter electrode in plan view may be separated from a portion of the auxiliary layer that overlaps the second counter electrode in plan view.

In this way, the auxiliary layer makes it possible to further enhance the photoelectric conversion function. Further, the separation of the auxiliary layer makes it possible to reduce a leak current flowing via the auxiliary layer.

Further, for example, the sealing layer may be in contact with the upper surface and end face of the first counter electrode and the upper surface and end face of the second counter electrode.

In this way, the provision of the sealing layer in the interelectrode region makes it possible to further reduce a leak current between the counter electrodes.

Further, for example, the at least one first pixel electrode may include a plurality of first pixel electrodes, and the at least one second pixel electrode may include a plurality of second pixel electrodes.

Further, for example, the imaging device may further include a first pixel electrode group including the plurality of first pixel electrodes and a second pixel electrode group including the plurality of second pixel electrodes. In the first pixel electrode group, the plurality of first pixel electrodes may be arrayed along a first direction. In the second pixel electrode group, the plurality of second pixel electrodes may be arrayed along the first direction. The first pixel electrode group and the second pixel electrode group may be arranged along a second direction orthogonal to the first direction. The first counter electrode may have an elongated shape extending along the first direction and cover the first pixel electrode group. The second counter electrode may have an elongated shape extending along the first direction and cover the second pixel electrode group.

This makes it possible, for example, to provide counter electrodes separately for each of rows or columns, thus making it possible to reduce potential variation and easily make a shading correction.

Further, for example, a distance between two first pixel electrodes of the plurality of first pixel electrodes may be shorter than a distance between each of the plurality of first pixel electrodes and a corresponding second pixel electrode of the plurality of second pixel electrodes. The two first pixel electrodes are adjacent to each other along the first direction and each of the plurality of first pixel electrodes is adjacent to the corresponding second pixel electrode in the second direction.

This makes it possible to secure a wide interelectrode region, thus making it possible to prevent a protective film from being cut due to depressions in the upper surface of the photoelectric converter. This makes it possible to enhance protective performance of the photoelectric converter.

Further, for example, in the first pixel electrode group, the plurality of first pixel electrodes may be arrayed along the first direction and the second direction, and in the second pixel electrode group, the plurality of second pixel electrodes may be arrayed along the first direction and the second direction.

This makes it possible to cover more than one rows or columns of pixel electrodes en bloc with one counter electrode, thus making it possible to reduce the number of counter electrodes. The reduction in the number of counter electrodes results in a reduction in the number of interelectrode regions, so that the number of depressions that are provided in the upper surface of the photoelectric converter decreases too. This makes it possible to make it less likely for the protective film to be cut due to the depressions in the upper surface of the photoelectric converter, thus making it possible to enhance the protective performance of the photoelectric converter.

Further, for example, the imaging device may further include a first electrode terminal, provided at an end of the first counter electrode on a first side, to which a first power supply voltage is applied and a second electrode terminal, provided at an end of the second counter electrode on the first side, to which a second power supply voltage is applied.

Further, for example, the imaging device may further include a first electrode terminal pair, provided at an end of the first counter electrode on a first side, to which a first power supply voltage is applied, a second electrode terminal pair, provided at an end of the first counter electrode on a second side opposite to the first side, to which the first power supply voltage is applied, a third electrode terminal pair, provided at an end of the second counter electrode on the first side, to which a second power supply voltage is applied, and a fourth electrode terminal pair, provided at an end of the second counter electrode on the second side, to which the second power supply voltage is applied.

Further, for example, the photoelectric conversion layer may contain an organic compound, and the sealing layer may not contain the organic compound.

Further, for example, a difference between the thickness of the portion of the photoelectric conversion layer in the interelectrode region and the thickness of the portion of the photoelectric conversion layer in the overlap region may be equal to or greater than 5 nm.

In another general aspect, the techniques disclosed here feature a method for manufacturing an imaging device. The method includes forming a photoelectric conversion layer continuously covering a first pixel electrode and a second pixel electrode spaced from the first pixel electrode, forming at least one counter electrode covering the photoelectric conversion layer, and etching, by using a first resist pattern as a mask, portions of the at least one counter electrode and a surface portion of the photoelectric conversion layer located in an interelectrode region between the first pixel electrode and the second pixel electrode in plan view.

Further, for example, the at least one counter electrode may include a first counter electrode and a second counter electrode spaced from the first counter electrode. The method may further include forming a sealing layer continuously covering an upper surface of the first counter electrode and an upper surface of the second counter electrode and containing an oxide of metal or a nitride of metal. The sealing layer may be in contact with the photoelectric conversion layer in the interelectrode region.

Further, for example, the at least one counter electrode may include a first counter electrode and a second counter electrode spaced from the first counter electrode. The method may further include forming an auxiliary layer located between the photoelectric conversion layer the first counter electrode and between the photoelectric conversion layer and the second counter electrode. The etching includes etching, by using the first resist pattern as a mask, a portion of the auxiliary layer located in the interelectrode region in plan view.

Further, for example, the photoelectric conversion layer may contain an organic substance, and in the forming of the photoelectric conversion layer, the photoelectric conversion layer may be formed by a vacuum evaporation method or a method of application.

Further, for example, in the forming of the sealing layer, the sealing layer may be formed by an atomic layer deposition method.

In the following, embodiments are specifically described with reference to the drawings.

It should be noted that the embodiments to be described below each illustrate a comprehensive and specific example. The numerical values, shapes, materials, constituent elements, placement and topology of constituent elements, steps, orders of steps, or other features that are shown in the following embodiments are just a few examples and are not intended to limit the present disclosure. Further, those of the constituent elements in the following embodiments which are not recited in an independent claim are described as optional constituent elements.

Further, the drawings are schematic views and are not necessarily strict illustrations. Accordingly, for example, the drawings are not necessarily to scale. Further, in the drawings, substantially the same components are given the same reference signs, and a repeated description may be omitted or simplified.

Further, terms such as "uniform" and "equal" used herein to show the way in which elements are interrelated, terms such as "trapezoid" and "triangle" used herein to show the shape of an element, and ranges of numerical values used herein are not expressions that represent only exact meanings but expressions that are meant to also encompass substantially equivalent ranges, e.g. differences of approximately several percent.

Further, the terms "above" and "below" used herein do not refer to an upward direction (upward in a vertical direction) and a downward direction (downward in a vertical direction) in absolute space recognition, but are used as terms that are defined by a relative positional relationship on the basis of an order of stacking in a stack configuration. Further, the terms "above" and "below" are applied not only in a case where two constituent elements are placed at a spacing from each other and another constituent element is present between the two constituent elements, but also in a case where two constituent elements are placed in close contact with each other and the two constituent elements touch each other.

EMBODIMENT

First, a structure of a photodetector of an imaging device according to an embodiment is described.

1. Comparative Examples of Cross-Section Structures

In the following, cross-section structures of photodetectors of imaging devices according to comparative examples are specifically described with reference to FIGS. 1 to 4.

1-1. Comparative Example 1

FIG. 1 is a cross-sectional view showing a photodetector of an imaging device according to Comparative Example 1. As shown in FIG. 1, a photodetector 100 includes a plurality of pixel electrodes 101, a photoelectric conversion layer 102, and a counter electrode 103. The photodetector 100 is provided over an insulating layer 104. The insulating layer 104 is provided with a plurality of connecting wires 105. Further, a protective film 106, an insulator film 107, and an insulator film 108 are provided in such a way as to cover the photodetector 100.

Each of the plurality of pixel electrodes 101 is an electrode for trapping signal charge generated in the photoelectric conversion layer 102. As a material of which the pixel electrodes 101 are made, an electrically-conductive material such as metal, a metal oxide, a metal nitride, or electrically-conductive polysilicon is used. The metal is for example aluminum, silver, copper, titanium, or tungsten. The metal nitride is for example titanium nitride or tantalum nitride. The electrically-conductive polysilicon is polysilicon given electrical conductivity by an impurity added thereto.

The plurality of pixel electrodes 101 are placed at clearances from one another. For example as shown in FIG. 1, a first pixel electrode 101a and a second pixel electrode 101b are out of contact with each other, and are placed at a predetermined distance from each other. It should be noted that the first pixel electrode 101a and the second pixel electrode 101b are those two of the plurality of pixel electrodes 101 which are adjacent to each other.

The photoelectric conversion layer 102 internally generates an electron-hole pair upon irradiation with light. The electron-hole pair is separated into an electron and a hole by an electric field that is applied to the photoelectric conversion layer 102, the electron and the hole each migrate toward a pixel electrode 101 or toward the counter electrode 103. Having migrated toward the pixel electrode 101, the hole or the electron is trapped as signal charge by the pixel electrode 101 and supplied to a charge detection circuit (not illustrated) via a connecting wire 105.

The photoelectric conversion layer 102 is formed of a publicly-known photoelectric conversion material. The photoelectric conversion material is for example an organic material, but may be an inorganic material. As the inorganic photoelectric conversion material, hydrogenated amorphous silicon, a compound semiconductor material, a metal-oxide semiconductor material, or other materials can be used. The compound semiconductor material is for example CdSe. The metal-oxide semiconductor material is for example ZnO.

In a case where the photoelectric conversion material is an organic material, a molecular design of the photoelectric conversion material can be comparatively freely made so that a desired photoelectric conversion characteristic is obtained. In a case where the photoelectric conversion material is an organic material, a photoelectric conversion layer 102 having a superior planarization property can be easily formed by a process of application involving the use of a solution containing the photoelectric conversion material. An organic semiconductor material can be formed, for example, by a vacuum evaporation method or a method of application.

In a case where the organic semiconductor material is used as the photoelectric conversion material, the photoelectric conversion layer 102 may be constituted by a film stack of a donor material and an acceptor material, or may be constituted by a mixed film of these materials. A structure of the film stack of a donor material and an acceptor material is called "heterojunction type". A structure of the mixed film of a donor material and an acceptor material is called "bulk heterojunction type".

A p-type semiconductor of an organic compound is a donating organic semiconductor, is typified mainly by a hole-transport organic compound, and refers to an organic compound having the property of easily donating electrons. Specifically, a p-type semiconductor of an organic compound refers to an organic compound that has a lower ionization potential when two organic compounds are used in contact with each other. Accordingly, any organic compound that has an electron-donating ability may be used as the donating organic semiconductor. Usable examples of the donating organic semiconductor include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyallylene compound, and a metal complex having a condensed aromatic carbon ring compound or a nitrogen-containing hetero ring compound as a ligand. It should be noted that examples of the condensed aromatic carbon ring compound include a naphthalene derivative, an anthracene derivative, a phenanthrene derivative, a tetracene derivative, a pyrene derivative, a perylene derivative, and a fluoranthene derivative. Without being limited to these, any organic compound that has a lower ionization potential than an organic compound used as an accepting organic compound can be used as the donating organic semiconductor.

An n-type organic semiconductor of an organic compound is an accepting organic semiconductor, is typified mainly by an electron-transport organic compound, and refers to an organic compound having the property of easily accepting electrons. Specifically, an n-type organic semiconductor of an organic compound refers to an organic compound that has a higher electron affinity when two organic compounds are used in contact with each other.

Accordingly, any organic compound that has an electron-accepting ability may be used as the accepting organic semiconductor. Usable examples of the accepting organic semiconductor include fullerene, a fullerene derivative, a condensed aromatic carbon ring compound, a polyallylene compound, a fluorene compound, a cyclopentadiene compound, a silyl compound, and a metal complex having a nitrogen-containing hetero ring compound as a ligand. Alternatively, a metal complex having as a ligand a 5- or 7-membered hetero ring compound containing a nitrogen atom, an oxygen atom, or a sulfur atom can be used as the accepting organic compound. It should be noted that examples of the 5- or 7-membered hetero ring compound containing a nitrogen atom, an oxygen atom, or a sulfur atom include pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazopyridine, dibenzazepine, and tribenzazepine. Without being limited to these, as noted above, any organic compound that has a higher electron affinity than an organic compound used as the donating organic compound can be used as the accepting organic semiconductor.

The photoelectric conversion layer 102 is included in a photoelectric converter that continuously covers an upper surface of each of the plurality of pixel electrodes 101. The photoelectric converter is a layer located between the plurality of pixel electrodes 101 and the counter electrode 103. In the example shown in FIG. 1, the photoelectric converter has a single-layer structure composed solely of the photoelectric conversion layer 102. In other words, the photoelectric conversion layer 102 is the single-layer structure photoelectric converter itself. Alternatively, the photoelectric converter may have a stack structure including one or more layers other than the photoelectric conversion layer 102. The one or more layers other than the photoelectric conversion layer 102 include an electron-blocking layer, an electron-injection layer, an electron-transport layer, a hole-blocking layer, a hole-injection layer, and a hole-transport layer, or other layers.

The term "continuous" means being not physically separated. For example, as shown in FIG. 1, the photoelectric conversion layer 102 continuously covers the upper surface of the first pixel electrode 101a and the upper surface of the second pixel electrode 101b. The photoelectric conversion layer 102 is not physically separated in a region between the first pixel electrode 101a and the second pixel electrode 101b.

Further, there is in-plane uniformity in film thickness of the photoelectric conversion layer 102. That is, the film thickness of a portion of the photoelectric conversion layer 102 in a region directly above a pixel electrode 101 and the film thickness of a portion of the photoelectric conversion layer 102 in a region between two pixel electrodes 101 are equal. The photoelectric conversion layer 102 is formed in the shape of a flat-plate sheet that covers the plurality of pixel electrodes 101.

The counter electrode 103 traps charge that is opposite in polarity to signal charge that the pixel electrodes 101 trap. To the counter electrode 103, a predetermined voltage is applied. This makes a potential difference between the counter electrode 103 and the plurality of pixel electrodes 101, so that an electric field is applied to the photoelectric conversion layer 102. The counter electrode 103 traps charge that, among holes and electrons generated in the photoelectric conversion layer 102, migrates toward the counter electrode 103 under the influence of the electric field.

The counter electrode 103 is located above the photoelectric conversion layer 102 and faces the plurality of pixel electrodes 101. The counter electrode 103 is made of a material such as a transparent conducting oxide or a conducting polymer. Usable examples of the transparent conducting oxide include ITO, IZO (indium zinc oxide), AZO (aluminum-doped zinc oxide), FTO (florine-doped tin oxide), $SnO_2$, $TiO_2$, and $ZnO_2$. The counter electrode 103 is made of one type or two or more types of transparent conducting oxide selected from among these transparent conducting oxides. Usable examples of the conducting polymer include PEDOT/PSS (poly(3,4-ethylenedioxythiophene)/poly(4-styrenesulfonate)). The conducting polymer may be one that is obtained by dispersing metal particles, particles of a transparent conducting oxide, or other particles in a polymer material. Alternatively, the counter electrode 103 may be a metal thin film that is so thin as to allow passage of light.

In Comparative Example 1, the counter electrode 103 is provided in such a way as to entirely cover an upper surface of the photoelectric conversion layer 102. As is the case with the photoelectric conversion layer 102, the counter electrode 103 continuously covers the upper surface of each of the plurality of pixel electrodes 101. That is, the counter electrode 103 is not physically separated, and covers the upper surface of the photoelectric conversion layer 102 with a uniform film thickness. The counter electrode 103 is not provided for each pixel electrode 101, but is a common electrode provided commonly to the plurality of pixel electrodes 101.

The insulating layer 104 is an insulating layer formed above a substrate (not illustrated). It should be noted that the substrate is provided, for example, with a transistor or other devices included in a signal processing circuit that processes signal charge generated by the photodetector 100. The insulating layer 104 has a single-layer structure or stack structure of, for example, tetraethyl orthosilicate (TEOS), a silicon oxide film, a silicon nitride film, or other layers.

The connecting wires 105 are provided separately for each of the pixel electrodes 101. Each of the connecting wires 105 is part of a wire electrically connecting a corresponding one of the pixel electrodes 101 with the signal processing circuit. As a material of which the connecting wires 105 are made, an electrically-conductive material such as metal, a metal oxide, a metal nitride, or electrically-conductive polysilicon is used.

The protective film 106 is an example of a sealing layer provided to prevent the photoelectric conversion layer 102 from touching air or moisture. Usable examples of a material of which the protective film 106 is made include an insulating material that is sufficiently low in moisture permeability and that is high in translucency. Specifically, the protective film 106 contains an oxide or nitride of metal. The protective film 106 is for example an aluminum oxide film.

The protective film 106 is provided above the counter electrode 103. Specifically, the protective film 106 is provided in such a way as to entirely cover an upper surface of the counter electrode 103. As is the case with the photoelectric conversion layer 102, the protective film 106 continuously covers the upper surface of each of the plurality of pixel electrodes 101. That is, the protective film 106 is not physically separated, and covers the upper surface of the counter electrode 103 with a uniform film thickness.

As is the case with the protective film 106, the insulator film 107 is provided to prevent the photoelectric conversion layer 102 from touching air or moisture. Usable examples of a material of which the insulator film 107 is made include an insulating material that is low in moisture permeability and that is high in translucency. The insulator film 107 is for example a silicon oxide film, a silicon nitride film, or a silicon oxynitride film.

The insulator film 107 is provided above the protecting film 106. Specifically, the insulator film 107 is provided in such a way as to entirely cover an upper surface of the protective film 106. As is the case with the photoelectric conversion layer 102, the insulator film 107 continuously covers the upper surface of each of the plurality of pixel electrodes 101. That is, the insulator film 107 is not physically separated, and covers the upper surface of the protective film 106 with a uniform film thickness.

The insulator film 108 is a planarizing film whose upper surface is flat. The insulator film 108 is made of a translucent material whose example is tetraethyl orthosilicate (TEOS).

The insulator film 108 is provided above the insulator film 107. Specifically, the insulator film 108 is provided in such a way as to entirely cover an upper surface of the insulator film 107. As is the case with the photoelectric conversion layer 102, the insulator film 108 continuously covers the upper surface of each of the plurality of pixel electrodes 101. That is, the insulator film 108 is not physically separated, and covers the upper surface of the insulator film 107 with a uniform film thickness.

It should be noted that the imaging device may not include at least one of the protective film 106, the insulator film 107, or the insulator film 108.

Thus, in the imaging device according to Comparative Example 1, the counter electrode 103 is not separated. For this reason, as mentioned above, there is a problem of shading due to the influence of a voltage drop in the counter electrode 103.

1-2. Comparative Example 2

Next, Comparative Example 2 is described with reference to FIG. 2. The following gives a description with a focus on differences from Comparative Example 1, and omits or simplifies a description of common features.

Figure 2:
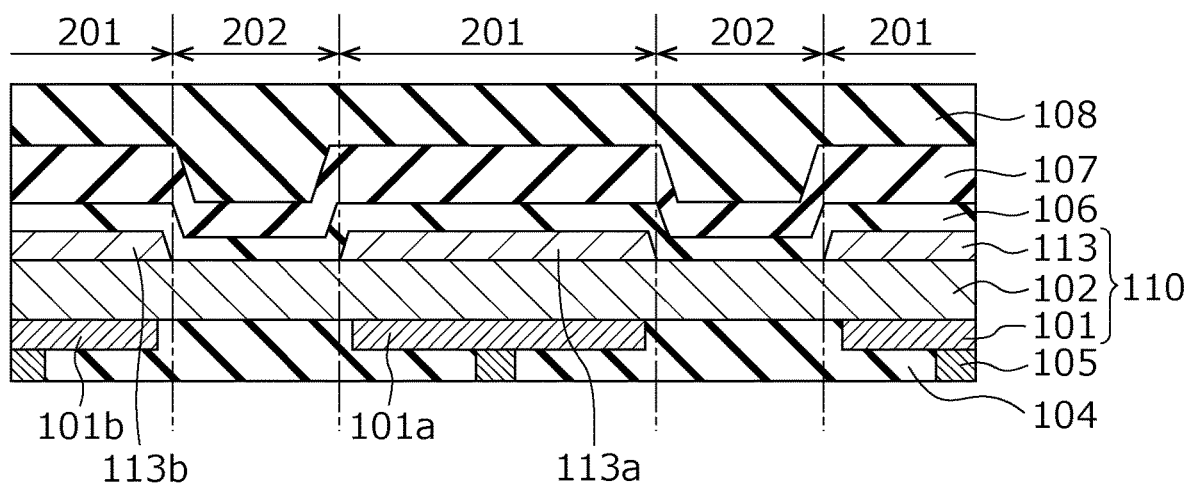
FIG. 2 is a cross-sectional view showing a photodetector according to Comparative Example 2.

FIG. 2 is a cross-sectional view showing a photodetector of an imaging device according to Comparative Example 2. As shown in FIG. 2, a photodetector 110 according to Comparative Example 2 differs from the photodetector 100 according to Comparative Example 1 in that the photodetector 110 according to Comparative Example 2 includes a plurality of counter electrodes 113 instead of the counter electrode 103.

The plurality of counter electrodes 113 are placed at clearances from one another. For example, as shown in FIG. 2, a first counter electrode 113a and a second counter electrode 113b are out of contact with each other, and are placed at a predetermined distance from each other. It should be noted that the first counter electrode 113a and the second counter electrode 113b are those two of the plurality of counter electrodes 113 which are adjacent to each other. The first counter electrode 113a faces the first pixel electrode 101a. The second counter electrode 113b faces the second pixel electrode 101b.

Each of the plurality of counter electrodes 113 traps charge that is opposite in polarity to signal charge that a pixel electrode 101 facing that counter electrode 113 traps. The counter electrodes 113 are provided, for example, separately for each of pixel electrode groups each including a plurality of pixel electrodes 101. Specifically, when seen in plan view, the counter electrodes 113 each have an elongated shape extending along a first direction. The plurality of counter electrodes 113 are arranged along a second direction orthogonal to the first direction. In the cross-section shown in FIG. 2, the first direction is a direction away from a viewer looking at the surface of paper, and the second direction is a direction from side to side of the surface of paper. Specific examples of planar shapes and planar layouts of the plurality of counter electrodes 113 and the plurality of pixel electrodes 101 will be described later.

A counter electrode 113 according to Comparative Example 2 has an end face formed in a forward tapered shape. The term "forward tapered shape" means that a normal to the end face extends obliquely upward. That is, as shown in FIG. 2, the counter electrode 113 has a cross-sectional shape formed in a trapezoidal shape with a lower base longer than an upper base. For example, an upper surface of the counter electrode 113 is smaller than a lower surface of the counter electrode 113. It should be noted that the lower base and the lower surface are a side and surface of the counter electrode 113 that face the photoelectric conversion layer 102. The upper base and the upper surface are a side and surface of the counter electrode 113 that face away from the photoelectric conversion layer 102.

An end face formed in a forward tapered shape makes it harder for etching damage by etching gas, oxygen, moisture, or other matter to be extended to a photoelectric conversion region than does an end face formed in a reverse tapered shape. This makes it possible to reduce deterioration of the photoelectric conversion function. It should be noted that the photoelectric conversion region is a region of the photoelectric conversion layer 102 in which a pixel electrode 101 and a counter electrode 113 overlap each other in plan view. In Comparative Example 2, in which a pixel electrode 101 is smaller than a counter electrode 113, the photoelectric conversion region is equivalent to a portion of the photoelectric conversion layer 102 that overlaps a pixel electrode 101 in plan view.

Further, an interelectrode distance between adjacent counter electrodes 113 is shorter than an interelectrode distance between adjacent pixel electrodes 101. It should be noted that the interelectrode distance between adjacent counter electrodes 113 is represented by b in FIGS. 9 to 11, which will be described later. Similarly, the interelectrode distance between adjacent pixel electrodes 101 is represented by a in FIGS. 9 to 11.

For example, the interelectrode distance between the first counter electrode 113a and the second counter electrode 113b is shorter than the interelectrode distance between the first pixel electrode 101a and the second pixel electrode 101b. The term "interelectrode distance" means the shortest distance between adjacent counter electrodes 113 or pixel electrodes 101. For example, the interelectrode distance between the first counter electrode 113a and the second counter electrode 113b is a distance between a lower end of an end face of the first counter electrode 113a and a lower end of an end face of the second counter electrode 113b. It should be noted that the interelectrode distance may be a distance between the center of the end face of the first counter electrode 113a and the center of the end face of the second counter electrode 113b.

The short interelectrode distance between adjacent counter electrodes 113 makes it possible to separate a photoelectric conversion region in the photoelectric conversion layer 102 from an end face of a counter electrode 113. This makes it possible to prevent etching damage from being extended to the photoelectric conversion region, making it possible to reduce deterioration of the photoelectric conversion function.

FIG. 2 illustrates an overlap region 201 that overlaps a counter electrode 113 in plan view and an interelectrode region 202 that is a region between two adjacent counter electrodes 113 in plan view. For example, the overlap region 201 is a region that overlaps the first counter electrode 113a or the second counter electrode 113b in plan view. The interelectrode region 202 is a region between the first counter electrode 113a and the second counter electrode 113b in plan view.

Specifically, the overlap region 201 is a region that overlaps the lower surface of a counter electrode 113 in plan view. The interelectrode region 202 is a region between the contours of the respective lower surfaces of two adjacent counter electrodes 113. It should be noted that the overlap region 201 and the interelectrode region 202 may be defined with reference to the upper surface of a counter electrode 113. Alternatively, the overlap region 201 and the interelectrode region 202 may be defined with reference to the center line of an end face of a counter electrode 113.

As can be seen in comparison with Comparative Example 1, the plurality of counter electrode 113 are separated from one another in Comparative Example 2. Specifically, in plan view, no counter electrode 113 is provided in the interelectrode region 202.

The plurality of counter electrodes 113 are formed by patterning the counter electrode 103 according to Comparative Example 1. Specifically, a plurality of counter electrodes 113 with clearances from one another are formed by forming a counter electrode 103 in the shape of a flat-plate sheet and then removing, by photolithography and etching, a portion of the counter electrode 103 located in the interelectrode region 202.

At this point in time, by utilizing, as a mask for etching, a resist pattern having an end face formed in a forward tapered shape, an end face of the counter electrode 103 can be formed in a forward tapered shape. The resist pattern is for example trapezoidal in cross-section, or may be triangular in cross-section.

Thus, the imaging device according to Comparative Example 2, in which the counter electrodes 113 are placed away from one another, can reduce the influence of shading. Meanwhile, during patterning of the counter electrodes 113, a portion of a surface of the photoelectric conversion layer 102 in the interelectrode region 202 becomes damaged by etching. Further, moisture or impurities are adsorbed onto the portion of the surface of the photoelectric conversion layer 102 in the interelectrode region 202. Due to the influence of such damage or impurities, a surface portion of the photoelectric conversion layer 102 may form a leak current pathway between adjacent counter electrodes 113. Accordingly, the imaging device according to Comparative Example 2 is undesirably incapable of reducing a leak current.

In Comparative Example 2 and the after-mentioned comparative examples and examples, the presence of the interelectrode region 202 in which no counter electrode 113 is provided causes the protective film 106 to continuously cover the upper surfaces of the plurality of counter electrodes 113 and be provided in contact with the photoelectric conversion layer 102 in the interelectrode region 202. As shown in FIG. 2, the protective film 106 and the insulator film 107 are provided along asperities that may be formed by the presence or absence of counter electrodes 113. Since the protective film 106 and the insulator film 107 are uniform in film thickness, the upper surface of the insulator film 107 forms asperities comparable to the asperities that may be formed by the presence or absence of counter electrodes 113. The insulator film 108 is provided in such a way as to fill the asperities on the upper surface of the insulator film 107, and planarizes the upper surface. For this reason, the insulator film 108 differs in film thickness between the overlap region 201 and the interelectrode region 202. Specifically, the film thickness of a portion of the insulator film 108 in the overlap region 201 is smaller than the film thickness of a portion of the insulator film 108 in the interelectrode region 202.

1-3. Comparative Example 3

Next, Comparative Example 3 is described with reference to FIG. 3. The following gives a description with a focus on differences from Comparative Example 2, and omits or simplifies a description of common features.

Figure 3:
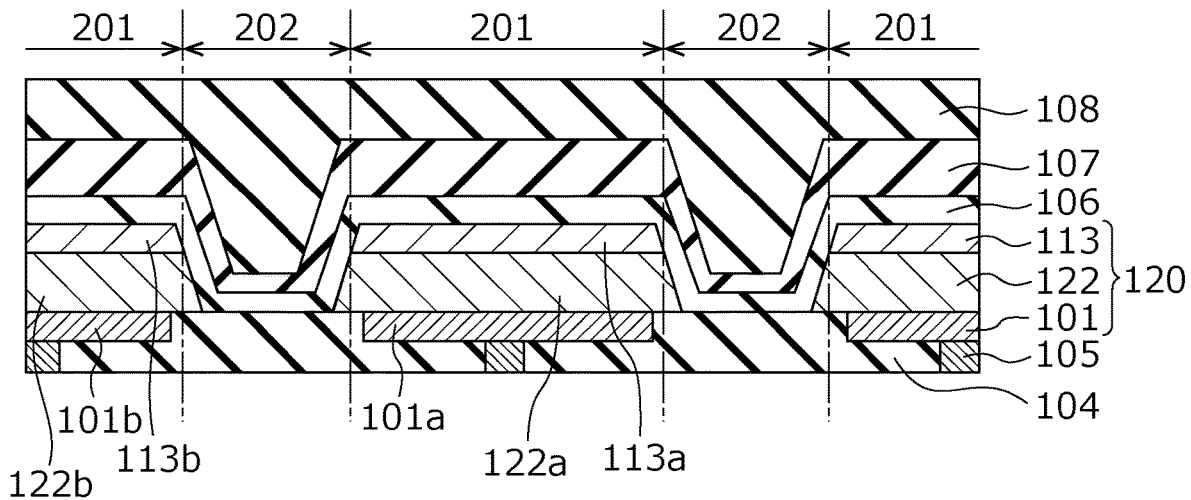
FIG. 3 is a cross-sectional view showing a photodetector according to Comparative Example 3.

FIG. 3 is a cross-sectional view showing a photodetector of an imaging device according to Comparative Example 3. As shown in FIG. 3, a photodetector 120 according to Comparative Example 3 differs from the photodetector 110 according to Comparative Example 2 in that the photodetector 120 according to Comparative Example 3 includes a plurality of photoelectric conversion layers 122 instead of the photoelectric conversion layer 102.

The plurality of photoelectric conversion layers 122 are placed at clearances from one another. For example, as shown in FIG. 3, a first photoelectric conversion layer 122a and a second photoelectric conversion layer 122b are out of contact with each other, and are placed at a predetermined distance from each other. It should be noted that the first photoelectric conversion layer 122a and the second photoelectric conversion layer 122b are those two of the plurality of photoelectric conversion layers 122 which are adjacent to each other. The first photoelectric conversion layer 122a is located between the first pixel electrode 101a and the first counter electrode 113a. The second photoelectric conversion layer 122b is located between the second pixel electrode 101b and the second counter electrode 113b.

As can be seen in comparison with Comparative Example 2, the photoelectric conversion layers 122 are separated for each counter electrode 113 in Comparative Example 3. Specifically, in plan view, no photoelectric conversion layer 122 is provided in the interelectrode region 202.

The plurality of photoelectric conversion layers 122 are formed by patterning the photoelectric conversion layer 102 according to Comparative Example 2. Specifically, a plurality of photoelectric conversion layers 122 with clearances from one another are formed by forming a photoelectric conversion layer 102 and a counter electrode 103 in sequence in the shapes of flat-plate sheets and then removing, by photolithography and etching, portions of the counter electrode 103 and the photoelectric conversion layer 102 located in the interelectrode region 202. That is, photoelectric conversion layers 122 separated for each counter electrode 113 are formed by continuously performing etching of the counter electrode 103 and etching of the photoelectric conversion layer 102 by using an identical resist pattern as a mask.

Thus, the imaging device according to Comparative Example 3, in which the counter electrodes 113 are placed away from one another as in the case of Comparative Example 2, can reduce the influence of shading. Meanwhile, during patterning of the photoelectric conversion layers 122, a portion of a surface of the insulating layer 104 in the interelectrode region 202 becomes damaged by etching. Further, moisture or impurities are adsorbed onto the portion of the surface of the insulating layer 104 in the interelectrode region 202. Due to the influence of such damage or impurities, a surface portion of the insulating layer 104 may form a leak current pathway between adjacent pixel electrodes 101. Accordingly, the imaging device according to Comparative Example 3 is undesirably incapable of reducing a leak current between pixel electrodes.

1-4. Comparative Example 4

Next, Comparative Example 4 is described with reference to FIG. 4. The following gives a description with a focus on differences from Comparative Example 3, and omits or simplifies a description of common features.

Figure 4:
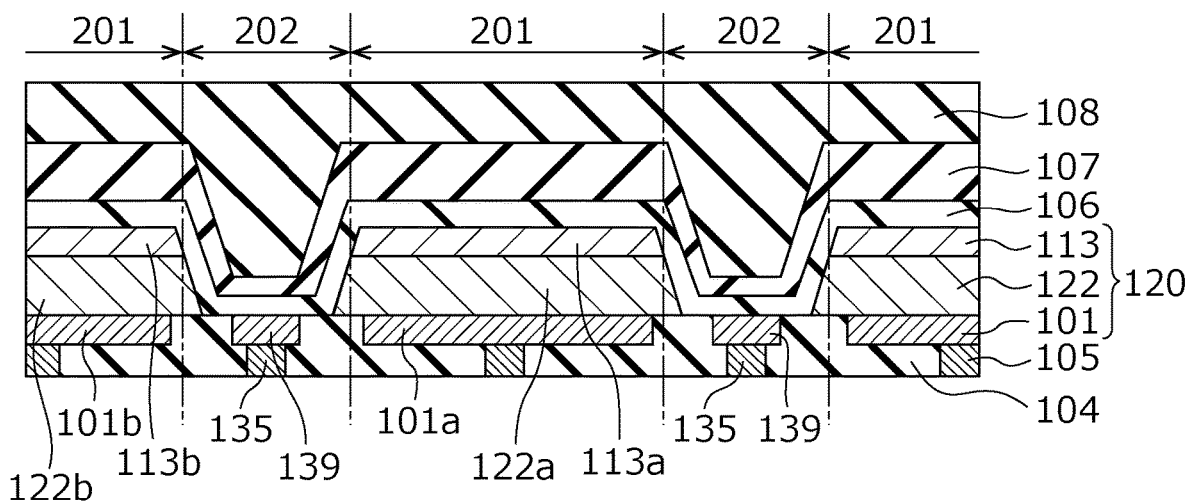
FIG. 4 is a cross-sectional view showing a photodetector according to Comparative Example 4.

FIG. 4 is a cross-sectional view showing a photodetector of an imaging device according to Comparative Example 4. As shown in FIG. 4, the imaging device according to Comparative Example 4 differs from the imaging device according to Comparative Example 3 in that the imaging device according to Comparative Example 4 further includes a shield electrode 139 and a plurality of connecting wires 135.

The shield electrode 139 is provided around a pixel electrode 101, and a predetermined voltage is applied to the shield electrode 139. The shield electrode 139 is formed, for example, in the shape of a grid that, when seen in plan view, surrounds each one of a plurality of the pixel electrodes 101 arrayed two-dimensionally. The application of an appropriate voltage to the shield electrode 139 allows transverse electric fields to be generated in the photoelectric conversion layers 122. This makes it possible to suppress transverse migration of signal charge within the photoelectric conversion layers 122.

Usable examples of a material of which the shield electrode 139 is made include an electrically-conductive material such as metal, a metal oxide, a metal nitride, or electrically-conductive polysilicon. The shield electrode 139 is formed, for example, of copper. It should be noted that the shield electrode 139 may be made of the same material as the pixel electrodes 101.

The plurality of connecting wires 135 are parts of wires through which to supply a voltage that is applied to the shield electrode 139. As is the case with the connecting wire 105, usable examples of a material of which the connecting wires 135 are made include an electrically-conductive material such as metal, a metal oxide, a metal nitride, or electrically-conductive polysilicon.

In a case where the shield electrode 139 is provided in such a way as to surround the pixel electrodes 101, the shield electrode 139 is also present in the interelectrode region 202 and exposed at an upper surface of the insulating layer 104 as shown in FIG. 4.

In this case, during patterning of the photoelectric conversion layers 122, the shield electrode 139 becomes oxidized by being exposed to etching gas, as the shield electrode 139 is exposed in the interelectrode region 202. The shield electrode 139 thus oxidized becomes insulative by loss of electrical conductivity and becomes incapable of fulfilling its shielding function. Further, during etching, metal materials contained in the shield electrode 139 may scatter to form a leak current pathway. Thus, the imaging device according to Comparative Example 4 too is undesirably incapable of reducing a leak current.

2. Examples of Cross-Section Structures

Next, cross-section structures of photodetectors of imaging devices according to examples are specifically described with reference to FIGS. 5 to 8. The following gives a description with a focus on differences from the aforementioned Comparative Examples 1 to 4, and omits or simplifies a description of common features.

2-1. Example 1

Figure 5:
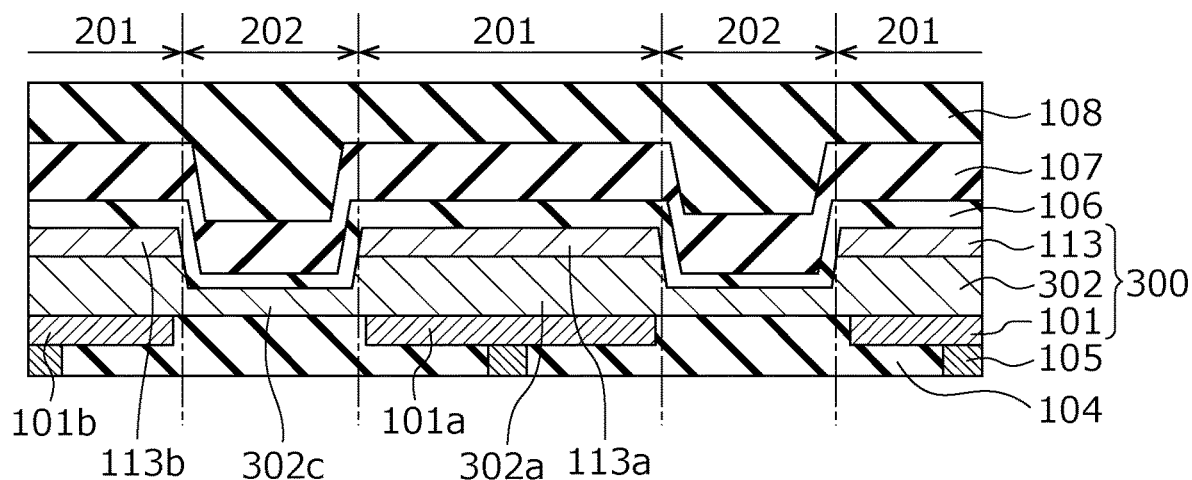
FIG. 5 is a cross-sectional view showing a photodetector according to Example 1.

FIG. 5 is a cross-sectional view showing a photodetector of an imaging device according to Example 1. As shown in FIG. 5, a photodetector 300 according to Example 1 differs from the photodetector 110 according to Comparative Example 2 in that the photodetector 300 according to Example 1 includes a photoelectric conversion layer 302 instead of the photoelectric conversion layer 102.

As is the case with the photoelectric conversion layer 102, the photoelectric conversion layer 302 continuously covers the upper surface of each of the plurality of pixel electrodes 101. That is, the photoelectric conversion layer 302 is provided in both the overlap region 201 and the interelectrode region 202.

In Example 1, the photoelectric conversion layer 302 is not uniform in film thickness. Specifically, the film thickness of a portion of the photoelectric conversion layer 302 in the interelectrode region 202 is smaller than the film thickness of a portion of the photoelectric conversion layer 302 in the overlap region 201. As shown in FIG. 5, the photoelectric conversion layer 302 includes an overlap portion 302a located in the overlap region 201 and a non-overlap portion 302c located in the interelectrode region 202. The film thickness of the non-overlap portion 302c is smaller than the film thickness of the overlap portion 302a. For example, the difference between the film thickness of the non-overlap portion 302c and the film thickness of the overlap portion 302a is equal to or greater than 5 nm. Specifically, the difference in level between a lower end of a counter electrode 113 and an upper surface of the non-overlap portion 302c is equal to or greater than 5 nm. This makes it possible to inhibit the generation of a tunnel current between the lower end of the counter electrode 113 and the upper surface of the non-overlap portion 302c, making it possible to reduce a leak current.

The film thickness of the non-overlap portion 302c may be equal to or less than ⅔, equal to or less than ½, or equal to or less than ⅓ of the film thickness of the overlap portion 302a. For example, the film thickness of the overlap portion 302a is 500 nm, and the film thickness of the non-overlap portion 302c is 300 nm. A lower limit on the film thickness of the non-overlap portion 302c is for example 5 nm.

The photoelectric conversion layer 302 has a flat lower surface. That is, the upper surface of each of the plurality of pixel electrodes 101 and the uppermost surface of the insulating layer 104 are flush with each other and form a flat surface. The photoelectric conversion layer 302 is provided in such a way as to touch and cover the flat surface. The flat lower surface of the photoelectric conversion layer 302 allows asperities to be formed on an upper surface of the photoelectric conversion layer 302 by the difference in film thickness of the photoelectric conversion layer 302. Specifically, an upper surface of the portion of the photoelectric conversion layer 302 in the interelectrode region 202 is more depressed than an upper surface of the portion of the photoelectric conversion layer 302 in the overlap region 201. That is, the upper surface of the non-overlap portion 302c is located below an upper surface of the overlap portion 302a.

The photoelectric conversion layer 302 is formed by partially removing a surface part of the photoelectric conversion layer 102 according to Comparative Example 2. Specifically, the photoelectric conversion layer 302 is formed by forming a photoelectric conversion layer 102 and a counter electrode 103 in sequence in the shapes of flat-plate sheets and then removing, by photolithography and etching, only surface parts of portions of the counter electrode 103 and the photoelectric conversion layer 102 located in the interelectrode region 202. That is, etching of the counter electrode 103 and etching of the photoelectric conversion layer 102 are continuously performed by using an identical resist pattern as a mask. At this point in time, the portion of the photoelectric conversion layer 102 located in the interelectrode region 202 is not completely removed but left with a predetermined film thickness. This causes the photoelectric conversion layer 302 to be formed with a small film thickness and a depressed upper surface in the interelectrode region 202.

As noted above, in the imaging device according to Example 1, since the upper surface of the portion of the photoelectric conversion layer 302 in the interelectrode region 202 is depressed, a leak current that flows along the upper surface is reduced. This makes it possible to reduce a leak current between adjacent counter electrodes 113.

Further, the photoelectric conversion layer 302 can be formed with a depressed upper surface by using, as a mask, a resist pattern which is identical to that used in the patterning of the counter electrodes 113. That is, the photoelectric conversion layer 302 can be simply formed, as no dedicated resist pattern is needed for the formation of the photoelectric conversion layer 302.

In Example 1, in which the photoelectric conversion layer 302 is also present in the interelectrode region 202, the protective film 106 continuously covers an upper surface of each of the plurality of counter electrodes 113 and is in contact with the photoelectric conversion layer 302 in the interelectrode region 202. The protective film 106 is in contact with the upper surface and end face of each of the plurality of counter electrodes 113. The covering of the end faces of the counter electrodes 113 by the protective film 106, which is insulative, makes it possible to further reduce a leak current between the counter electrodes 113.

The protective film 106 is formed by using a technique that ensures high coatability, as the protective film 106 is formed along steps based on the presence or absence of counter electrodes 113. For example, the protective film 106 is formed by using an atomic layer deposition (ALD) method or a chemical vapor deposition) method. Higher coatability allows further reduction of a leak current.

It should be noted that the lower surface of the photoelectric conversion layer 302 may not be flat. For example, the lower surface of the photoelectric conversion layer 302 may be provided with steps attributed to the pixel electrodes 101. The heights of the steps range, for example, from several nanometers to 20 nm. The upper surface of each of the plurality of pixel electrodes 101 may be located above the uppermost surface of the insulating layer 104. For example, the plurality of pixel electrodes 101 may be provided over the flat uppermost surface of the insulating layer 104, and a space between the pixel electrodes 101 may not be filled with an insulating layer.

2-2. Example 2

Next, Example 2 is described with reference to FIG. 6. The following gives a description with a focus on differences from Example 1, and omits or simplifies a description of common features.

Figure 6:
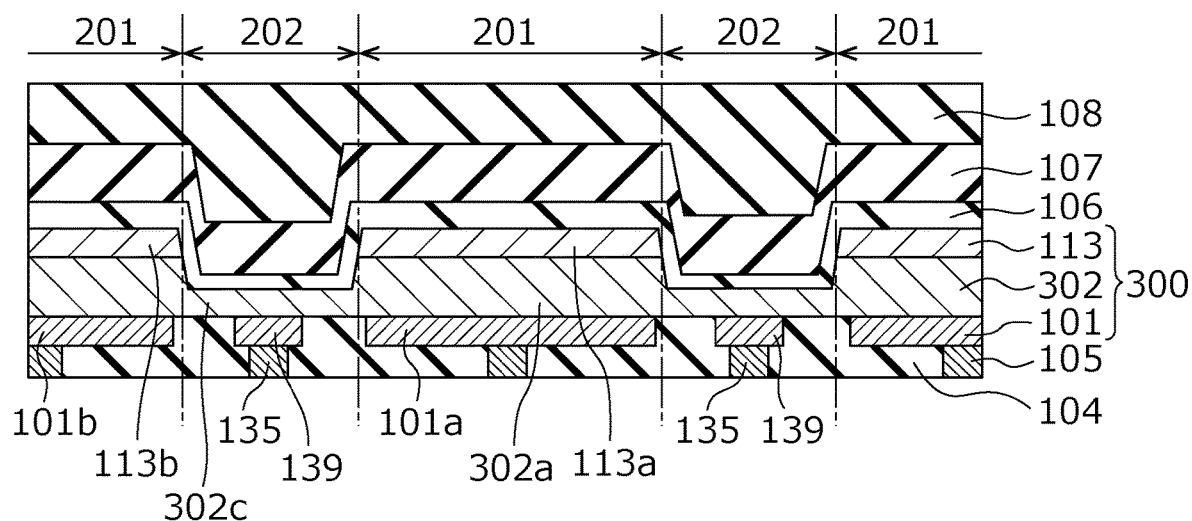
FIG. 6 is a cross-sectional view showing a photodetector according to Example 2.

FIG. 6 is a cross-sectional view showing a photodetector of an imaging device according to Example 2. As shown in FIG. 6, the imaging device according to Example 2 differs from the imaging device according to Example 1 in that the imaging device according to Example 2 further includes a shield electrode 139 and a plurality of connecting wires 135. The shield electrode 139 and the connecting wires 135 are the same as those of Comparative Example 4.

In Example 2, as in the case of Example 1, the photoelectric conversion layer 302 is provided in the interelectrode region 202. That is, the shield electrode 139 has its upper surface covered with the photoelectric conversion layer 302. The upper surface of the shield electrode 139 remains covered with the photoelectric conversion layer 302 without becoming exposed during the patterning of the counter electrodes 113 and the partial removal of the photoelectric conversion layer 302. For this reason, such oxidization of the shield electrode 139 and such formation of a leak current pathway as those shown in Comparative Example 4 are both inhibited.

It should be noted that since the photoelectric conversion layer 302 is also provided in the interelectrode region 202, signal charge generated by one overlap portion 302a may migrate to a neighboring overlap portion 302a via a non-overlap portion 302c. In Example 2, the provision of the shield electrode 139 makes it possible to suppress transverse migration of signal charge, thus making it possible to reduce the occurrence of a color mixture or other phenomenon due to the mixing of signal charge.

2-3. Example 3

Next, Example 3 is described with reference to FIG. 7. The following gives a description with a focus on differences from Example 1, and omits or simplifies a description of common features.

Figure 7:
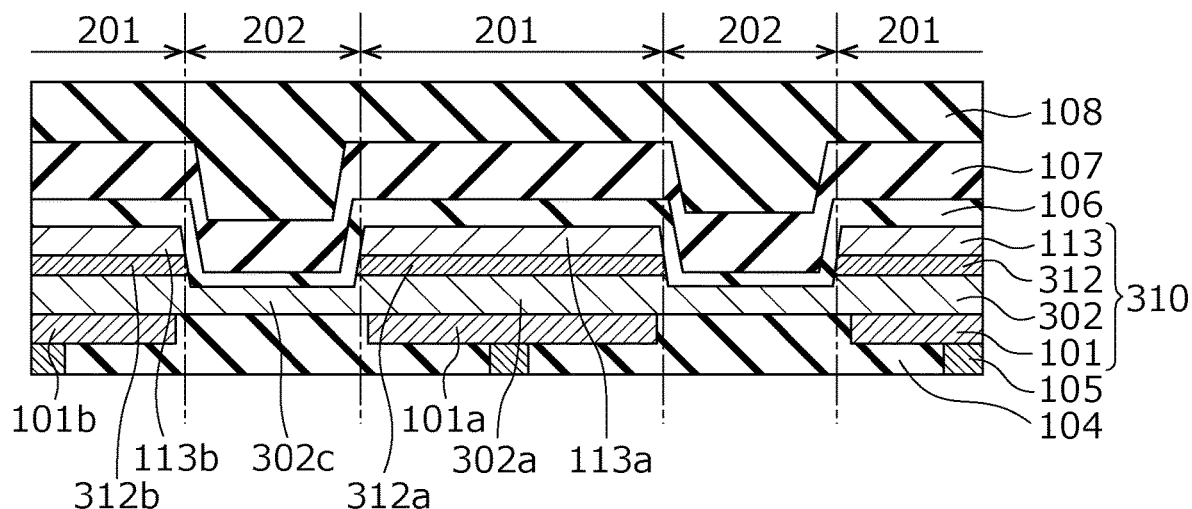
FIG. 7 is a cross-sectional view showing a photodetector according to Example 3.

FIG. 7 is a cross-sectional view showing a photodetector of an imaging device according to Example 3. As shown in FIG. 7, a photodetector 310 according to Example 3 differs from the photodetector 300 according to Example 1 in that the photodetector 310 according to Example 3 further includes an auxiliary layer 312.

The auxiliary layer 312 is included in a photoelectric converter located between the plurality of pixel electrodes 101 and the plurality of counter electrodes 113. In Example 3, the photoelectric converter is constituted by the auxiliary layer 312 and the photoelectric conversion layer 302. The auxiliary layer 312 is for example a charge-blocking layer that blocks passage of signal charge that a pixel electrode 101 traps. In a case where signal charge is a hole, the auxiliary layer 312 is a hole-blocking layer that blocks passage of holes and that allows passage of electrons. In a case where signal charge is an electron, the auxiliary layer 312 is an electron-blocking layer that blocks passage of electrons and that allows passage of holes. The auxiliary layer 312 may be a hole-injection layer, a hole-transport layer, an electron-injection layer, of an electron-transport layer.

As shown in FIG. 7, the auxiliary layer 312 is provided for each counter electrode 113. For example, the auxiliary layer 312 is separated into a portion 312a that overlaps the first counter electrode 113a in plan view and a portion 312b that overlaps the second counter electrode 113b in plan view. In other words, no auxiliary layer 312 is provided in the interelectrode region 202.

An auxiliary layer 312 separated for each counter electrode 113 is formed by continuously performing etching of the auxiliary layer 312 by using an identical resist pattern as a mask after the patterning of the counter electrodes 113. That is, the auxiliary layer 312 can be simply separated, as no dedicated resist pattern is needed for the separation of the auxiliary layer 312.

The auxiliary layer 312 is formed of a less insulative material than the photoelectric conversion layer 302. For this reason, in a case where the auxiliary layer 312 is continuously provided between a plurality of counter electrodes 113, the auxiliary later 312 per se tends to form a leak current pathway. On the other hand, in Example 3, the separation of the auxiliary layer 312 makes it possible to reduce a leak current flowing via the auxiliary layer 312.

In Example 3, the photodetector 310 may include the photoelectric conversion layer 102 instead of the photoelectric conversion layer 302. That is, the photoelectric conversion layer of the photodetector 310 may be the same in film thickness in the interelectrode region 202 and the overlap region 201.

Further, the auxiliary layer 312 may be left with a predetermined film thickness without being completely removed in the interelectrode region 202. That is, as is the case with the photoelectric conversion layer 302, the film thickness of a portion of the auxiliary layer 312 in the interelectrode region 202 may be smaller than the film thickness of a portion of the auxiliary layer 312 in the overlap region 201.

2-4. Example 4

Next, Example 4 is described with reference to FIG. 8. The following gives a description with a focus on differences from Example 1, and omits or simplifies a description of common features.

Figure 8:
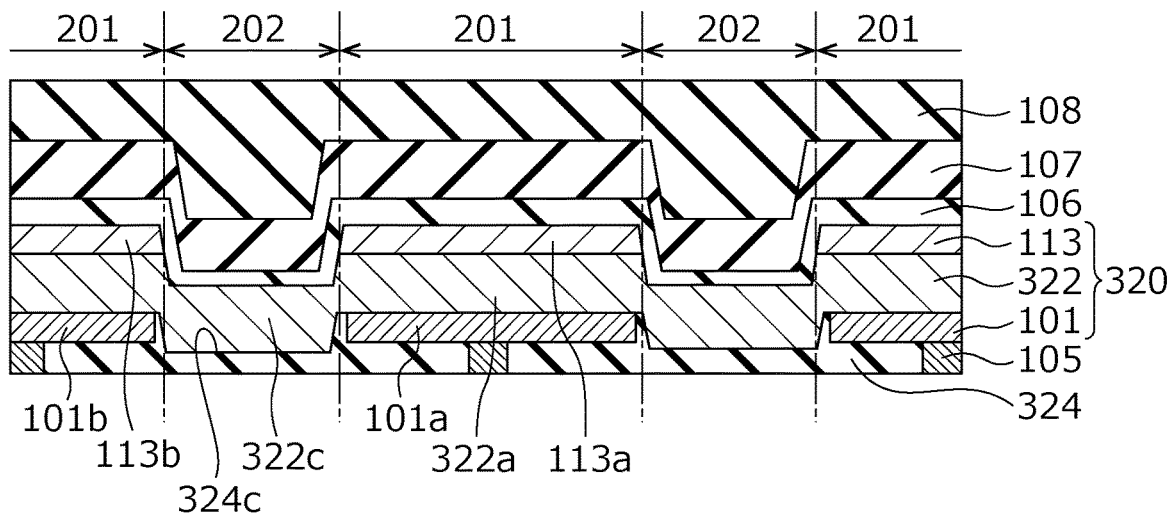
FIG. 8 is a cross-sectional view showing a photodetector according to Example 4.

FIG. 8 is a cross-sectional view showing a photodetector of an imaging device according to Example 4. As shown in FIG. 8, a photodetector 320 according to Example 4 differs from the photodetector 300 according to Example 1 in that the photodetector 320 according to Example 4 includes a photoelectric conversion layer 322 instead of the photoelectric conversion layer 302. Further, the photodetector 320 is provided in such a way as to cover an insulating layer 324 instead of the insulating layer 104.

The uppermost surface of the insulating layer 324 is not flat. As shown in FIG. 8, a depression 324c is formed in the uppermost surface of the insulating layer 324 in the interelectrode region 202. The depression 324c is formed, for example, by removing, by photolithography and etching, a portion of an insulating layer 104 with a planarized uppermost surface, particularly a surface portion of the insulating layer 104 located in the interelectrode region 202. Alternatively, the depression 324c may be a space between adjacent pixel electrodes 101. The plurality of pixel electrodes 101 may be formed over the planarized uppermost surface of the insulating layer 104, and a space between adjacent pixel electrodes 101 may be utilized as a depression 324c.

The photoelectric conversion layer 322 is provided with a uniform film thickness along an inner surface of the depression 324c. Specifically, the film thickness of an overlap portion 322a of the photoelectric conversion layer 322 is equal to the film thickness of a non-overlap portion 322c of the photoelectric conversion layer 322. This causes an upper surface of a portion of the photoelectric conversion layer 322 in the interelectrode region 202 to be more depressed than an upper surface of a portion of the photoelectric conversion layer 322 in the overlap region 201.

In the imaging device according to Example 4, since the upper surface of the portion of the photoelectric conversion layer 322 in the interelectrode region 202 is depressed, a leak current that flows along the upper surface is reduced. This makes it possible to reduce a leak current between adjacent counter electrodes 113.

In Examples 3 and 4 too, the shield electrode 139 and the connecting wires 135 may be provided.

3. Planar Layouts

Next, examples of planar layouts of counter electrodes and pixel electrodes are described with reference to FIGS. 9 to 12. Examples 5 to 8, which are described below, are applicable as planar layouts to any of the aforementioned Examples 1 to 4.

3-1. Example 5

First, Example 5 is described with reference to FIG. 9.

Figure 9:
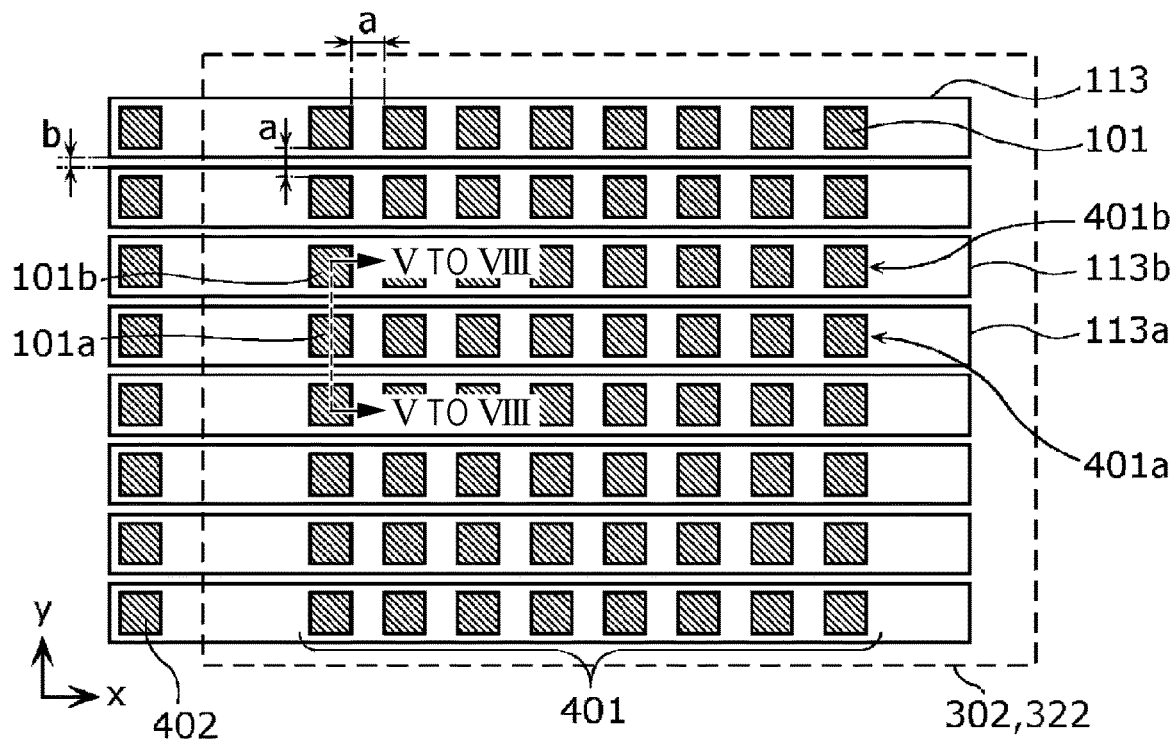
FIG. 9 is a top view showing counter electrodes, pixel electrodes, and electrode terminals of an imaging device according to Example 5.

FIG. 9 is a top view showing counter electrodes, pixel electrodes, and electrode terminals of an imaging device according to Example 5. As shown in FIG. 9, in the imaging device according to Example 5, the plurality of pixel electrodes 101 are arrayed two-dimensionally in plan view. The pixel electrodes 101 are arrayed at equal spacings in an x-axis direction and a y-axis direction. In the example shown in FIG. 9, the interelectrode distance between adjacent pixel electrodes 101 is represented by a.

It should be noted that an x axis and a y axis are two axes orthogonal to each other. The x-axis direction is an example of the first direction, along which the pixel electrodes 101 are arranged. The y-axis direction is an example of the second direction orthogonal to the first direction. An x-y plane is a plane parallel to the substrate of the imaging device. For example, the uppermost surface of the insulating layer 104 shown in FIG. 5 or other drawings is parallel to the x-y plane.

A pixel electrode group 401 shown in FIG. 9 includes a plurality of pixel electrodes 101 arrayed along the x-axis direction. A plurality of the pixel electrode groups 401 are arranged along the y-axis direction. It should be noted that the number of pixel electrodes 101 that are included in a pixel electrode group 401, i.e. the number of pixel electrodes 101 that are arrayed along the x-axis direction, may be 1, and is not limited to particular values. Further, the number of pixel electrode groups 401 that are arrayed along the y-axis direction is not limited to particular values, provided it is more than 1.

The plurality of counter electrodes 113 each have an elongated shape extending along the x-axis direction. The counter electrodes 113 covers the pixel electrode groups 401. Specifically, the counter electrodes 113 are provided separately for each of the pixel electrode groups 401.

A relationship between the planar layout according to Example 5 and the cross-section structures according to Examples 1 to 4 is described here. Specifically, a cross-section taken along line V TO VIII-V TO VIII shown in FIG. 9 is equivalent to the cross-sectional view shown in FIGS. 5 to 8.

For example, a plurality of the first pixel electrodes 101a are arrayed in the x-axis direction and included in a first pixel electrode group 401a. The first counter electrode 113a has an elongated shape extending along the x-axis direction and covers the first pixel electrode group 401a.

A plurality of the second pixel electrodes 101b are arrayed in the x-axis direction and included in a second pixel electrode group 401b. The second counter electrode 113b has an elongated shape extending along the x-axis direction and covers the second pixel electrode group 401b. It should be noted that the first pixel electrode group 401a and the second pixel electrode group 401b are those ones of the plurality of pixel electrode groups 401 which are adjacent to each other in the y-axis direction.

As shown in FIG. 9, the interelectrode distance a between pixel electrodes 101 adjacent to each other in the y-axis direction is longer than the interelectrode distance b between counter electrodes 113 adjacent to each other in the y-axis direction. This makes it possible to reduce deterioration of the photoelectric conversion function as mentioned above.

In FIG. 9, a planar shape of the photoelectric conversion layer 302 or 322 is indicated by dashed lines. As shown in FIG. 9, the photoelectric conversion layer 302 or 322 is provided in such a way as to continuously cover the plurality of pixel electrodes 101 arrayed two-dimensionally. Specifically, the photoelectric conversion layer 302 or 322 continuously covers all pixel electrodes 101. The plurality of counter electrodes 113 are provided in such a way as to extend out of the photoelectric conversion layer 302 or 322 on a negative side of the x axis.

The plurality of counter electrodes 113 are connected to electrode terminals 402 in portions thereof extending out of the photoelectric conversion layer 302 or 322, respectively. Specifically, an electrode terminal 402 for use in feeding is provided at an end of each of the plurality of counter electrodes 113 on the negative side of the x axis. That is, to each of the plurality of counter electrodes 113, a power supply voltage is applied from the negative side of the x axis. So-called one-sided feeding is performed on the plurality of counter electrodes 113. It should be noted that a plurality of the electrode terminals 402 are not covered with the photoelectric conversion layer 302 or 322.

At this point in time, due to the influence of a voltage drop caused by a resistance component of a counter electrode 113, there is a great potential difference between a portion of the counter electrode 113 close to an electrode terminal 402 and a portion of the counter electrode 113 away from the electrode terminal 402. In Example 5, in which the electrode terminals 402 are provided on the negative side of the x axis with respect to all counter electrodes 113 and the counter electrodes 113 extend toward a positive side of the x axis, directions in which potential differences increase coincide with the x-axis direction. This makes it only necessary to make the same shading correction to all counter electrodes 113, thus making it possible to easily perform a correction process.

3-2. Example 6

Next, Example 6 is described with reference to FIG. 10. The following gives a description with a focus on differences from Example 5, and omits or simplifies a description of common features.

Figure 10:
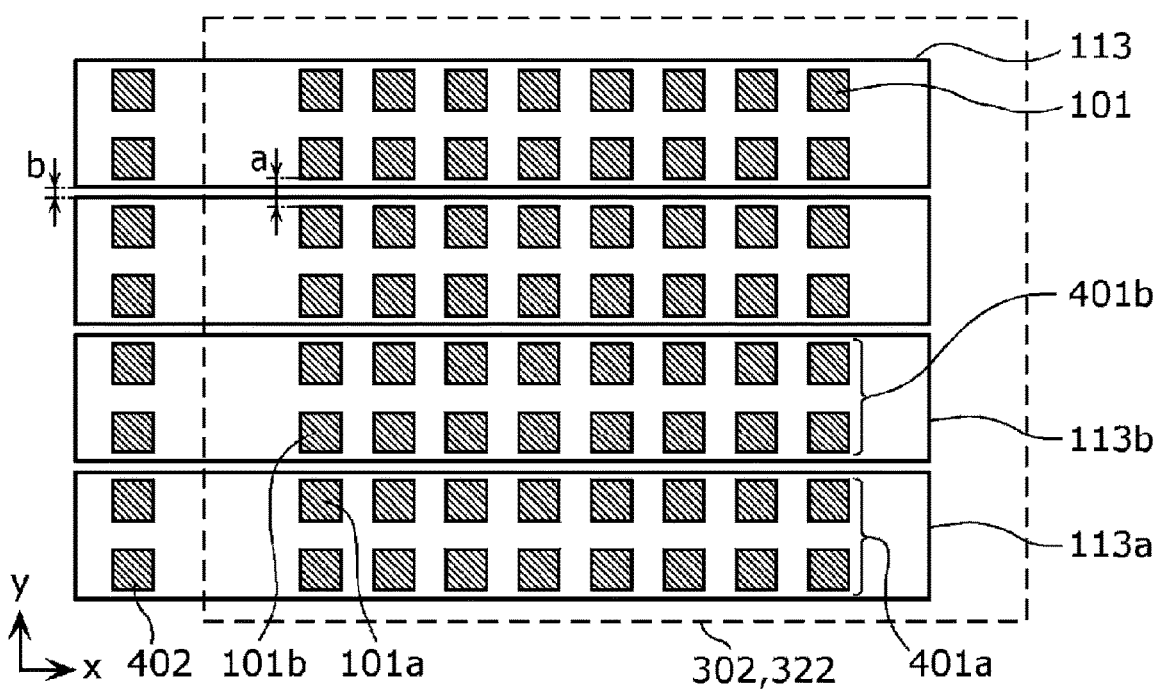
FIG. 10 is a top view showing counter electrodes, pixel electrodes, and electrode terminals of an imaging device according to Example 6.

FIG. 10 is a top view showing counter electrodes, pixel electrodes, and electrode terminals of an imaging device according to Example 6. In the example shown in FIG. 10, each of the pixel electrode groups 401 includes a plurality of pixel electrodes 101 arranged along the x-axis direction and the y-axis direction. Specifically, each of the pixel electrode groups 401 includes a total of sixteen pixel electrodes 101 arranged in two rows and eight columns. It should be noted that each of the pixel electrode groups 401 may include pixel electrodes 101 arranged in more than one rows and one column.

As in the case of Example 5, the counter electrodes 113 are provided separately for each of the pixel electrode groups 401. Accordingly, each of the counter electrodes 113 covers more than one rows of pixel electrodes 101. For example, the first counter electrode 113a covers two rows of first pixel electrodes 101a. Similarly, the second counter electrode 113b covers two rows of second pixel electrodes 101b.

As noted above, the number of pixel electrodes 101 that are covered with one counter electrode 113 in the y-axis direction, along which the counter electrodes 113 are arranged, may be equal to or larger than 2. As in the case of Example 5, the imaging device according to Example 6 makes it possible to easily make a shading correction.

In the imaging device according to Example 6, a cross-section orthogonal to the x axis does not coincide with cross-sections of the imaging devices according to Examples 1 to 4 shown in FIGS. 5 to 8. Specifically, the cross-section orthogonal to the x axis is equivalent to a cross-section in which two pixel electrodes 101 and a connecting wire 105 are provided instead of one pixel electrode 101 and a connecting wire 105 that are located directly below one counter electrode 113 in the cross-sections shown in FIGS. 5 to 8.

In Example 6, two electrode terminals 402 are provided at an end of a counter electrode 113 on the negative side of the x axis. It should be noted that the size of an electrode terminal 402 is the same as the size of a pixel electrode 101, but may be different from the size of a pixel electrode 101. For example, one large electrode terminal 402 may be provided at an end of a counter electrode 113.

3-3. Example 7

Next, Example 7 is described with reference to FIG. 11. The following gives a description with a focus on differences from Example 5, and omits or simplifies a description of common features.

Figure 11:
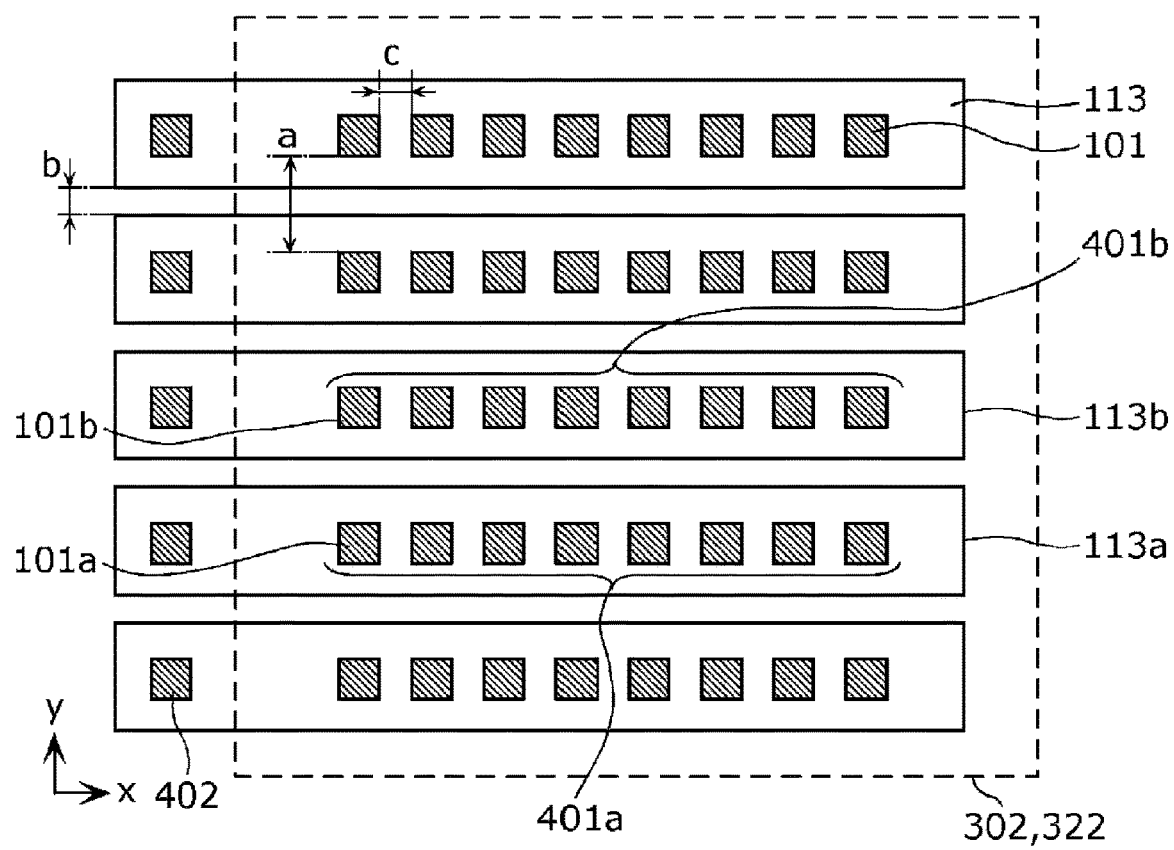
FIG. 11 is a top view showing counter electrodes, pixel electrodes, and electrode terminals of an imaging device according to Example 7.

FIG. 11 is a top view showing counter electrodes, pixel electrodes, and electrode terminals of an imaging device according to Example 7. In the example shown in FIG. 11, the distance between pixel electrode 101 adjacent to each other in the x-axis direction is different from the distance between pixel electrode 101 adjacent to each other in the y-axis direction. Specifically, the interelectrode distance between pixel electrode 101 adjacent to each other in the x-axis direction is smaller than the distance between pixel electrode 101 adjacent to each other in the y-axis direction. For example, assuming that as shown in FIG. 11, a is the interelectrode distance between pixel electrodes 101 arranged along the y-axis direction and c is the interelectrode distance between pixel electrodes 101 arranged along the x-axis direction, a>c. As in the case of Examples 5 and 6, assuming that b is the interelectrode distance between counter electrodes 113, a>b is satisfied in Example 7. The interelectrode distance b between counter electrodes 113 may be equal to the interelectrode distance c, may be longer than c, or may be shorter than c.

In Example 7, an increase in the interelectrode distance a can lead to an increase in the interelectrode distance b between counter electrodes 113. The increase in the interelectrode distance b makes it possible to make the inclination of the end faces of the counter electrodes 113 and the upper surface of the photoelectric conversion layer 302 or 322 gentle. This can make it hard for cuts to be made in step portions of the protective film 106 and the insulator film 107, which are formed along the end faces of the counter electrodes 113 and the upper surface of the photoelectric conversion layer 302 or 322. This makes it possible to reduce deterioration of protective performance of the photoelectric conversion layer 302 or 322.

In a case where one counter electrode 113 covers more than one rows of pixel electrodes 101 as in the case of Example 6, the more than one rows of pixel electrodes 101 covered with the counter electrode 113 may be at equal spacings in a row-wise direction and a column-wise direction. For example, the interelectrode distance between first pixel electrodes 101a adjacent to each other in the y-axis direction may be equal to the interelectrode distance between first pixel electrodes 101a adjacent to each other in the x-axis direction and shorter than the interelectrode distance between a first pixel electrode 101a and a second pixel electrode 101b. Similarly, the interelectrode distance between second pixel electrodes 101b adjacent to each other in the y-axis direction may be equal to the interelectrode distance between second pixel electrodes 101b adjacent to each other in the x-axis direction and shorter than the interelectrode distance between a first pixel electrode 101a and a second pixel electrode 101b.

3-4. Example 8

Next, Example 8 is described with reference to FIG. 12. The following gives a description with a focus on differences from Example 5, and omits or simplifies a description of common features.

Figure 12:
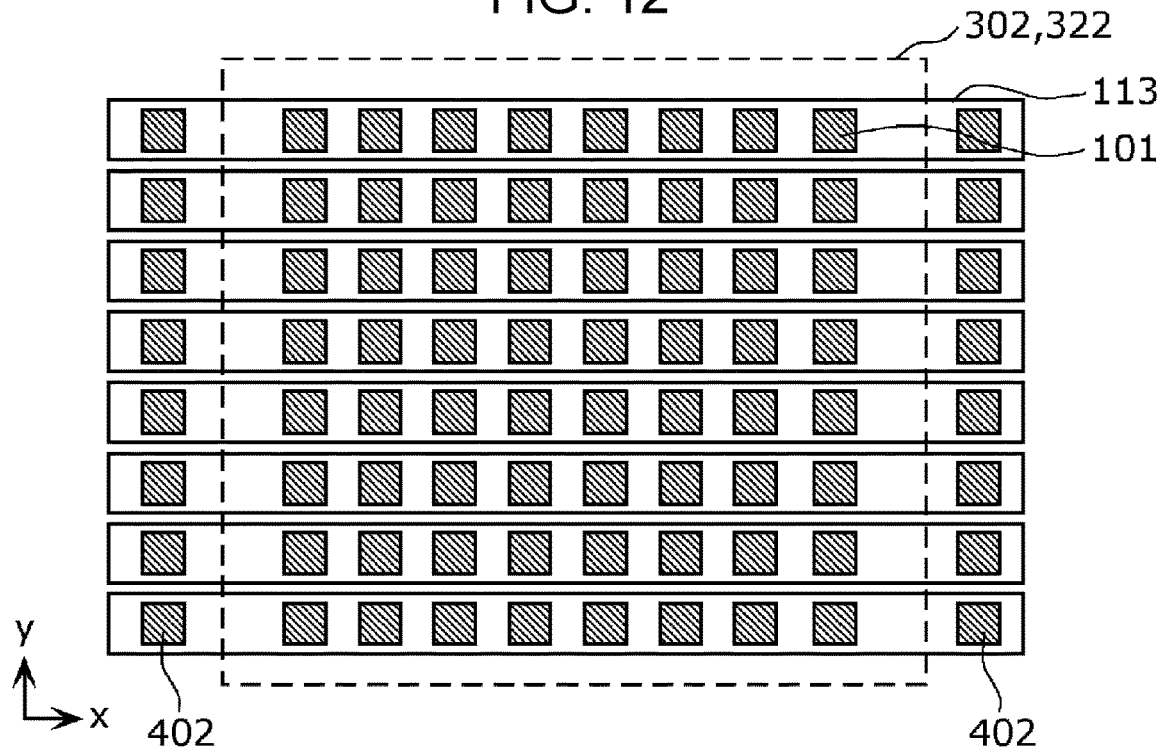
FIG. 12 is a top view showing counter electrodes, pixel electrodes, and electrode terminals of an imaging device according to Example 8.

FIG. 12 is a top view showing counter electrodes, pixel electrodes, and electrode terminals of an imaging device according to Example 8. In the example shown in FIG. 12, each of the plurality of counter electrodes 113 is provided in such a way as to extend out of the photoelectric conversion layer 302 or 322 on the positive and negative sides of the x axis. The electrode terminals 402 are provided in ones at both ends of each of the counter electrodes 113 in a longitudinal direction. That is, to each of the plurality of counter electrodes 113, a power supply voltage is applied from each of the positive and negative sides of the x axis. So-called two-sided feeding is performed on the plurality of counter electrodes 113.

In this case, due to the influence of a voltage drop caused by a resistance component of a counter electrode 113, there is a great potential difference between a portion of the counter electrode 113 close to an electrode terminal 402 and a portion of the counter electrode 113 away from the electrode terminal 402. In Example 8, in which the electrode terminals 402 are provided on both the positive and negative sides of the x axis with respect to all counter electrodes 113, a maximum potential difference is reached between a central portion and either end portion of each of the counter electrodes 113. Although a maximum potential difference is reached in a place which is different from that in which a maximum potential difference is reached in Example 5, directions in which potential differences change coincide with the x-axis direction for all counter electrodes 113 as in the case of Example 5. This makes it only necessary to make the same shading correction to all counter electrodes 113, thus making it possible to easily perform a correction process.

In Example 6 or 7 too, two-sided feeding may be performed.

4. Imaging Device

Next, an imaging device according to the present embodiment is described with reference to FIGS. 13 and 14.

Figure 13:
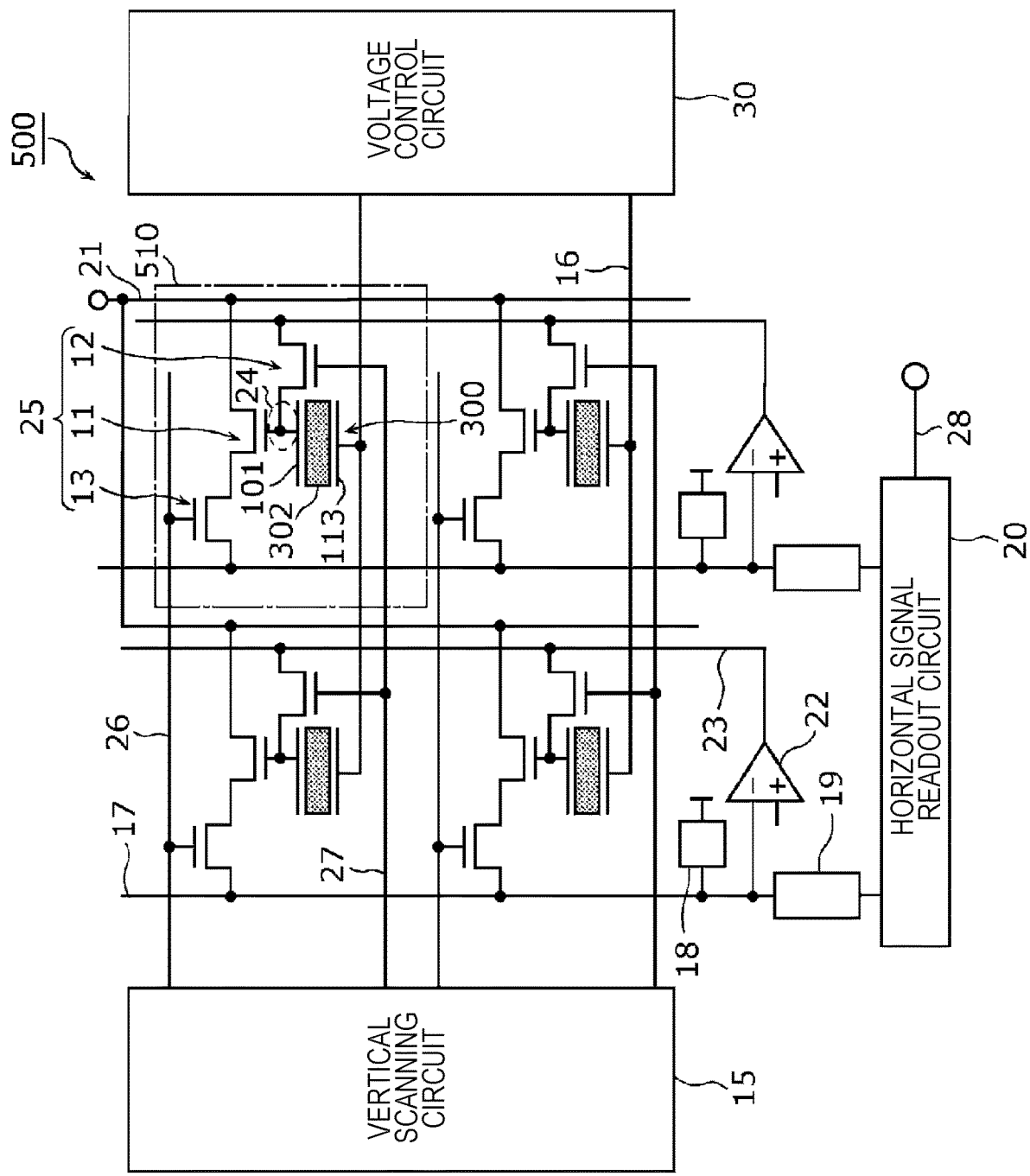
FIG. 13 is a circuit diagram showing a circuit configuration of an imaging device according to an embodiment.
Figure 14:
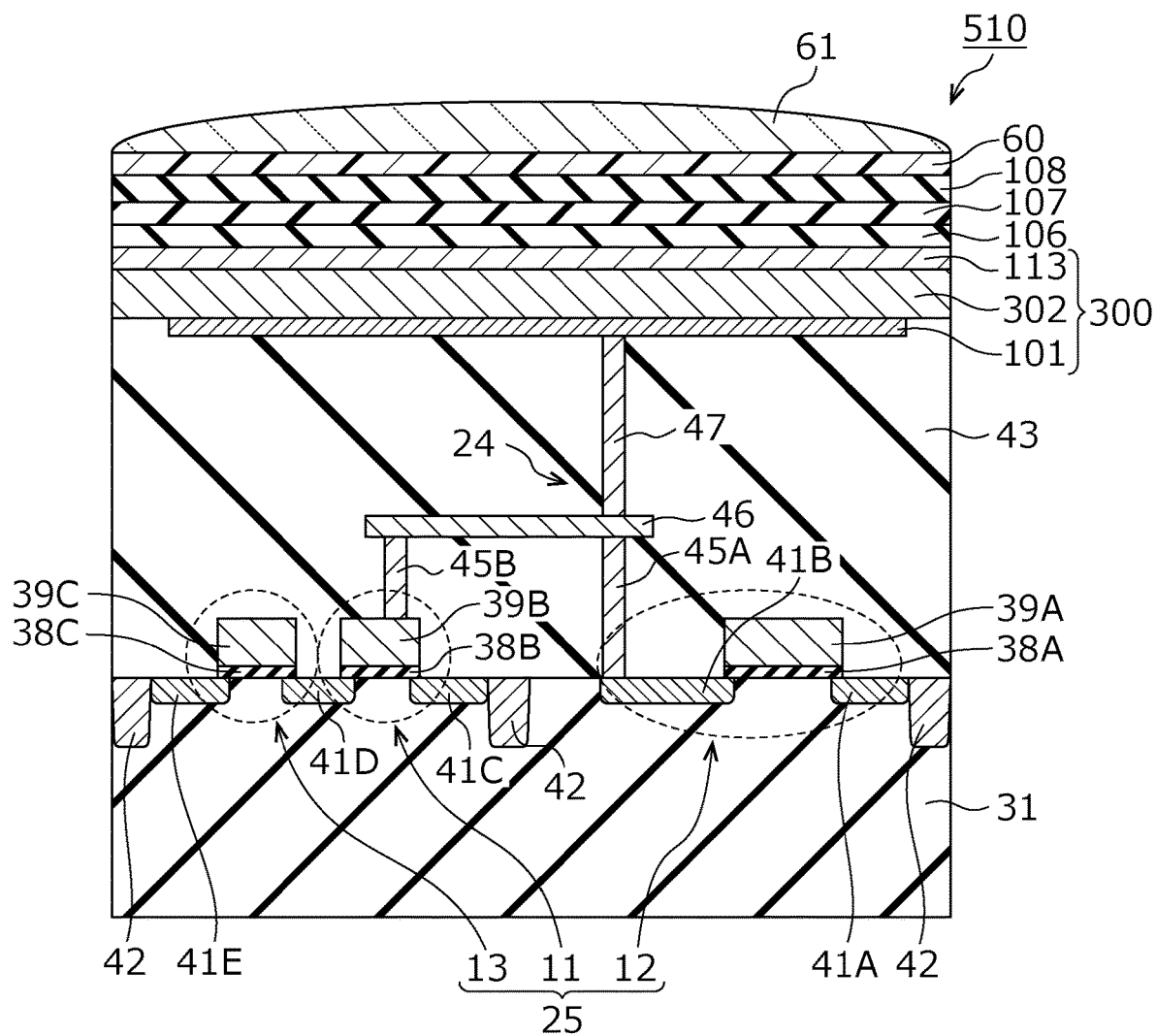
FIG. 14 is a cross-sectional view of a unit pixel of the imaging device according to the embodiment.

FIG. 13 is a circuit diagram showing a circuit configuration of an imaging device 500 according to the present embodiment. FIG. 14 is a cross-sectional view of a unit pixel 510 of the imaging device 500 according to the present embodiment.

4-1. Circuit Configuration

In the following, first, a circuit configuration of the imaging device 500 according to the present embodiment is described. As shown in FIG. 13, the imaging device 500 includes a plurality of the unit pixels 510 and a peripheral circuit. Each of the plurality of unit pixels 510 includes a charge detection circuit 25, a photodetector 300, and a charge accumulation node 24 electrically connected to the charge detection circuit 25 and the photodetector 300.

The imaging device 500 is for example an organic image sensor that is implemented by a one-chip integrated circuit, and has a pixel array including a plurality of unit pixels 510 arrayed two-dimensionally. The plurality of unit pixels 510 are arrayed two-dimensionally, i.e. in a row-wise direction and a column-wise direction, and form a photosensitive region serving as a pixel region. FIG. 13 shows an example in which unit pixels 510 are arrayed in two rows and two columns in a matrix. The imaging device 500 may be a line sensor. In that case, the plurality of unit pixels 510 may be arrayed one-dimensionally. The terms "row-wise direction" and "column-wise direction" refer to directions in which a row and a column extend, respectively. That is, the column-wise direction is a vertical direction, and the row-wise direction is a horizontal direction.

Each of the unit pixels 510 includes a charge accumulation node 24 electrically connected to a photodetector 300 and a charge detection circuit 25. The charge detection circuit 25 includes an amplifying transistor 11, a reset transistor 12, and an address transistor 13.

The photodetector 300 includes a pixel electrode 101, a photoelectric conversion layer 302, and a counter electrode 113. To the counter electrode 113, a predetermined voltage is applied from a voltage control circuit 30 via a counter electrode signal line 16.

The pixel electrode 101 is connected to a gate electrode 39B (see FIG. 14) of the amplifying transistor 11. Signal charge collected by the pixel electrode 101 is accumulated in the charge accumulation node 24, which is located between the pixel electrode 101 and the gate electrode 39B of the amplifying transistor 11. In the present embodiment, the signal charge is a hole. Alternatively, the signal charge may be an electron.

The signal charge accumulated in the charge accumulation node 24 is applied to the gate electrode 39B of the amplifying transistor 11 as a voltage corresponding to the amount of signal charge. The amplifying transistor 11 amplifies this voltage. The voltage thus amplified is selectively read out as a signal voltage by the address transistor 13. The reset transistor 12 has either its source or drain electrode connected to the pixel electrode 101 and resets the signal charge accumulated in the charge accumulation node 24. In other words, the reset transistor 12 resets the potentials of the gate electrode 39B of the amplifying transistor 11 and the pixel electrode 101.

As shown in FIG. 13, the imaging device 500 has power-supply wires 21, vertical signal lines 17, address signal lines 26, and reset signal lines 27 in order to selectively perform the aforementioned operation in the plurality of unit pixels 510. These lines are connected to each of the unit pixels 510. Specifically, each of the power-supply wires 21 is connected to either source or drain electrodes of amplifying transistors 11. Each of the vertical signal lines 17 is connected to either source or drain electrodes of address transistors 13. Each of the address signal lines 26 is connected to gate electrodes 39C (see FIG. 14) of address transistors 13. Each of the reset signal lines 27 is connected to gate electrodes 39A (see FIG. 14) of reset transistors 12.

The peripheral circuit includes a vertical scanning circuit 15, a horizontal signal readout circuit 20, a plurality of column signal processing circuits 19, a plurality of load circuits 18, a plurality of differential amplifiers 22, and a voltage control circuit 30. The vertical scanning circuit 15 is also referred to as "row scanning circuit". The horizontal signal readout circuit 20 is also referred to as "column scanning circuit". The column signal processing circuits 19 are also referred to as "row signal accumulation circuits". The differential amplifiers 22 are also referred to as "feedback amplifiers".

The vertical scanning circuit 15 is connected to the address signal lines 26 and the reset signal lines 27. The vertical scanning circuit 15 selects, on a row-by-row basis, a plurality of unit pixels 510 arranged in each row and performs a readout of signal voltages and a reset of the potentials of the pixel electrodes 101. The power-supply wires 21, which are source follower power sources, supply predetermined power supply voltages separately to each of the unit pixels 510. The horizontal signal readout circuit 20 is electrically connected to the plurality of column signal processing circuits 19. Each of the column signal processing circuits 19 is electrically connected to unit pixels 510 arranged in the corresponding column via a vertical signal line 17 belonging to the corresponding column. The load circuits 18 are electrically connected separately to each of the vertical signal lines 17. The load circuits 18 and the amplifying transistors 11 form source follower circuits.

The plurality of differential amplifiers 22 are provided separately in correspondence with each of the columns. Each of the differential amplifiers 22 has its negative input terminal connected to a corresponding one of the vertical signal lines 17. Each of the differential amplifiers 22 has its output terminal connected to unit pixels 510 via a feedback line 23 belonging to the corresponding column.

The vertical scanning circuit 15 applies, to the gate electrodes 39C of address transistors 13 through an address signal line 26, a row selection signal that controls the turning on and turning off of the address transistors 13. In this way, a row to be read out is scanned and selected. Signal voltages are read out from the selected row of unit pixels 510 to the vertical signal line 17. The vertical scanning circuit 15 applies, to the gate electrodes 39A of reset transistors 12 via a reset signal line 27, a reset signal that controls the turning on and turning off of the reset transistors 12. In this way, a row of unit pixels 510 to be subjected to a reset operation is selected. Each of the vertical signal lines 17 transmits, to a corresponding one of the column signal processing circuits 19, signal voltages read out from unit pixels 510 selected by the vertical scanning circuit 15.

The column signal processing circuits 19 perform noise suppression signal processing, which is typified by correlated double sampling, analog-to-digital conversion (AD conversion), or other processing.

The horizontal signal readout circuit 20 reads out signals in sequence from the plurality of column signal processing circuits 19 to a horizontal common signal line 28.

Each of the differential amplifiers 22 is electrically connected via a feedback line 23 to the others of the source and drain electrodes of reset transistors 12 that are not connected to the pixel electrodes 101. Accordingly, each of the differential amplifiers 22 receives output values from address transistors 13 through its negative input terminal when the address transistors 13 and the reset transistor 12 are electrically continuous. Each of the differential amplifiers 22 performs a feedback operation so that the gate potentials of amplifying transistors 11 become predetermined feedback voltages. At this point in time, the output voltage value of the differential amplifier 22 is 0 V or a positive voltage of nearly 0 V. The term "feedback voltage" means an output voltage of a differential amplifier 22.

The voltage control circuit 30 may generate a constant control voltage or may generate a plurality of control voltages of different values. For example, the voltage control circuit 30 may generate two or more control voltages of different values or may generate a control voltage that continuously varies within a predetermined range. The voltage control circuit 30 determines, in accordance with an instruction from an operator who operates the imaging device 500 or an instruction from another controller of the imaging device 500, the value of a control voltage to be generated and generates a control voltage value of the value thus determined. The voltage control circuit 30 is provided outside the photosensitive region as part of the peripheral circuit. It should be noted that the photosensitive region is substantially identical to the pixel region.

For example, when the voltage control circuit 30 generates two or more control voltages of different values and applies the control voltages to counter electrodes 113, variations are caused in spectral-response characteristic of the photoelectric conversion layer 302. Further, this spectral-response characteristic varies within a range including such a spectral-response characteristic that the sensitivity of the photoelectric conversion layer 302 to light to be detected becomes zero. In this way, for example, during a readout of detection signals by unit pixels 510 for each row in the imaging device 500, the effect of light that is incident during the readout of the detection signals can be substantially eliminated by applying such control voltages to the counter electrodes 113 from the voltage control circuit 30 that the sensitivity of the photoelectric conversion layer 302 becomes zero. Therefore, even when detection signals are read out substantially for each row, a global shutter operation can be achieved.

In the present embodiment, as shown in FIG. 13, the voltage control circuit 30 applies control voltages via a counter electrode signal line 16 to the counter electrode 113 of unit pixels 510 arrayed in a row-wise direction. By so doing, the voltage control circuit 30 effects changes in voltage between the pixel electrodes 101 and the counter electrode 113 and switches spectral-response characteristics in the photodetector 300. Alternatively, the voltage control circuit 30 achieves an electronic shutter operation by applying a control voltage so that such a spectral-response characteristic is obtained that the sensitivity to light becomes zero at a predetermined timing during imaging. It should be noted that the voltage control circuit 30 may apply control voltages to the pixel electrodes 101.

In order for the photodetector 300 to be irradiated with light and for the pixel electrodes 101 to trap electrons as signal charge, the pixel electrodes 101 are set at a higher potential than the counter electrode 113. This causes the electrons to migrate toward the pixel electrodes 101. At this point in time, electric currents flow from the pixel electrodes 101 toward the counter electrode 113, as the direction of migration of electrons is opposite to the direction of flow of an electric current. Further, in order for the photodetector 300 to be irradiated with light and for the pixel electrodes 101 to trap holes as signal charge, the pixel electrodes 101 are set at a lower potential than the counter electrode 113. At this point in time, electric currents flow from the counter electrode 113 toward the pixel electrodes 101.

4-2. Cross-section Configuration

Next, an example of a specific cross-section configuration of a unit pixel 510 of the imaging device 500 is described with reference to FIG. 14. As shown in FIG. 14, the unit pixel 510 includes a semiconductor substrate 31, a charge detection circuit 25, a photodetector 300, and a charge accumulation node 24. A plurality of the unit pixels 510 are formed on the semiconductor substrate 31. For example, the photodetector 300 is provided above the semiconductor substrate 31. The charge detection circuit 25 is provided inside and above the semiconductor substrate 31.

The semiconductor substrate 31 is an insulating substrate or other substrates having a semiconductor layer provided on a surface thereof on which the photosensitive area is formed and, for example, is a p-type silicon substrate. The semiconductor substrate 31 has impurity regions 41A, 41B, 41C, 41D, and 41E and an element separation region 42 for electrical separation between unit pixels 510. In this example, the element separation region 42 is also provided between the impurity region 41B and the impurity region 41C. This reduces leakage of signal charge accumulated in the charge accumulation node 24. It should be noted that the element separation region 42 is formed, for example, by performing ion implantation of acceptors under predetermined implantation conditions.

The impurity regions 41A, 41B, 41C, 41D, and 41E are for example diffusion layers formed in the semiconductor substrate 31. In this example, the impurity regions 41A, 41B, 41C, 41D, and 41E are n-type impurity regions. As shown in FIG. 14, the amplifying transistor 11 includes the impurity region 41C, the impurity region 41D, a gate insulator film 38B, and the gate electrode 39B. The impurity region 41C and the impurity region 41D function as source and drain regions, respectively, of the amplifying transistor 11. The amplifying transistor 11 has its channel region formed between the impurity region 41C and the impurity region 41D.

Similarly, the address transistor 13 includes the impurity region 41D, the impurity region 41E, a gate insulator film 38C, and the gate electrode 39C. In the example shown in FIG. 14, the amplifying transistor 11 and the address transistor 13 are electrically connected to each other by sharing the impurity region 41D with each other. The impurity region 41D and the impurity region 41E function as source and drain regions, respectively, of the address transistor 13. The impurity region 41E is connected to a vertical signal line 17 shown in FIG. 13.

The reset transistor 12 includes the impurity region 41A, the impurity region 41B, a gate insulator film 38A, and the gate electrode 39A. The impurity region 41A and the impurity region 41B function as source and drain regions, respectively, of the reset transistor 12. The impurity region 41A is connected to a reset signal line 27 shown in FIG. 13.

The gate insulator film 38A, the gate insulator film 38B, and the gate insulator film 38C are each an insulator film formed of an insulating material. The insulator film has, for example, a single-layer structure or stack structure of a silicon oxide film or a silicon nitride film.

The gate electrode 39A, the gate electrode 39B, and the gate electrode 39C are each formed of an electrically-conductive material. The electrically-conductive material is for example electrically-conductive polysilicon.

Over the semiconductor substrate 31, an interlayer insulating layer 43 is stacked in such a way as to cover the amplifying transistor 11, the address transistor 13, and the reset transistor 12. In the interlayer insulating layer 43, a wiring layer (not illustrated) may be disposed. The wiring layer is formed from metal such as copper and, for example, may include wires such as the aforementioned vertical signal lines 17 as parts thereof. The number of insulating layers in the interlayer insulating layer 43 and the number of layers that are included in the wiring layer disposed in the interlayer insulating layer 43 may be set to arbitrary values.

The interlayer insulating layer 43 has disposed therein a contact plug 45A connected to the impurity region 41B of the reset transistor 12, a contact plug 45B connected to the gate electrode 39B of the amplifying transistor 11, a contact plug 47 connected to the pixel electrode 101, and a wire 46 connecting the contact plug 47, the contact plug 45A, and the contact plug 45B with one another. This causes the impurity region 41B of the reset transistor 12 to be electrically connected to the gate electrode 39B of the amplifying transistor 11.

Over the interlayer insulating layer 43, the photodetector 300 is disposed. A specific configuration of the photodetector 300 is the same as that shown in FIG. 5. It should be noted that the interlayer insulating layer 43 and the contact plug 47 are equivalent to the insulating layer 104 and a connecting wire 105 shown in FIG. 5, respectively. The electrode terminals 402 shown in FIGS. 9 to 12 are not provided, for example, in the unit pixels 510 but provided in a peripheral edge portion of the photosensitive region.

It should be noted that the imaging device 500 may include the photodetector 310 shown in FIG. 7 or the photodetector 320 shown in FIG. 8 instead of the photodetector 300. Alternatively, as shown in FIG. 6, the imaging device 500 may include a shield electrode 139 and connecting wires 135.

The protective film 106, the insulator film 107, the insulator film 108, and a color filter 60 are provided in this order above the photodetector 300. A microlens 61 is provided above the color filter 60. The color filter 60 is for example formed as an on-chip color filter by patterning, and is formed of, photosensitive resin or other substances having a dye or a pigment is dispersed therein. The microlens 61 is provided, for example, as an on-chip microlens, and is formed of an ultraviolet-sensitive material or other materials.

The imaging device 500 can be manufactured using a common semiconductor manufacturing process. In particular, in a case where a silicon substrate is used as the semiconductor substrate 31, the imaging device 500 can be manufactured using various silicon semiconductor processes.

As noted above, the imaging device 500 includes the photodetector 300 according to Example 5. For this reason, as mentioned above, the imaging device 500 can reduce a leak current between adjacent counter electrodes 113.

Other Embodiments

In the foregoing, imaging devices according to one or more aspects have been described with reference to embodiments; however, the present disclosure is not intended to be limited to these embodiments. Applications to the present embodiments of various types of modification conceived of by persons skilled in the art and embodiments constructed by combining constituent elements of different embodiments are encompassed in the scope of the present disclosure, provided such applications and embodiments do not depart from the spirit of the present disclosure.

For example, in the embodiment described above, the interelectrode distance between adjacent counter electrodes 113 may be equal to the interelectrode distance between pixel electrodes 101. Alternatively, the interelectrode distance between adjacent counter electrodes 113 may be longer than the interelectrode distance between pixel electrodes 101. Further, for example, a counter electrode 113 may have an end face formed in a reverse tapered shape. These are effective, for example, in a case where a photoelectric converter including the photoelectric conversion layer 302 is formed of a material that is highly resistant to etching damage or other cases.

Further, each of the embodiments described above is subject, for example, to various changes, substitutions, additions, and omissions in the scope of the claims or the scope of equivalents thereof.

The present disclosure can be utilized as an imaging device with a reduced leak current between adjacent counter electrodes and, for example, can be utilized in a camera, a ranging device, or other devices.

What is claimed is:

1. An imaging device comprising:
   at least one first pixel electrode;
   at least one second pixel electrode spaced from the at least one first pixel electrode;
   a photoelectric converter continuously covering an upper surface of the at least one first pixel electrode and an upper surface of the at least one second pixel electrode, the photoelectric converter including a photoelectric conversion layer;
   a first counter electrode located above the photoelectric converter, the first counter electrode facing the at least one first pixel electrode;
   a second counter electrode located above the photoelectric converter and electrically separated from the first counter electrode, the second counter electrode facing the at least one second pixel electrode; and
   a sealing layer continuously covering an upper surface of the first counter electrode and an upper surface of the second counter electrode, the sealing layer containing an oxide of metal or a nitride of metal, wherein
   a first portion of an upper surface of the photoelectric converter in an interelectrode region between the first counter electrode and the second counter electrode in plan view is more depressed than a second portion of the upper surface of the photoelectric converter in an overlap region overlapping the first counter electrode or the second counter electrode in plan view, and
   the sealing layer is in contact with the photoelectric converter in the interelectrode region.

2. The imaging device according to claim 1, wherein a thickness of a portion of the photoelectric converter in the interelectrode region is smaller than a thickness of a portion of the photoelectric converter in the overlap region.

3. The imaging device according to claim 1, wherein a thickness of a portion of the photoelectric conversion layer in the interelectrode region is smaller than a thickness of a portion of the photoelectric conversion layer in the overlap region.

4. The imaging device according to claim 1, wherein a distance between the first counter electrode and the second counter electrode is shorter than a distance between the at least one first pixel electrode and the at least one second pixel electrode.

5. The imaging device according to claim 1, wherein
   the first counter electrode has an end face having a forward tapered shape or a shape perpendicular to the upper surface of the first counter electrode, and
   the second counter electrode has an end face having a forward tapered shape or a shape perpendicular to the upper surface of the second counter electrode.

6. The imaging device according to claim 1, wherein
   the photoelectric converter further includes an auxiliary layer located between the photoelectric conversion layer and the first counter electrode and between the photoelectric conversion layer and the second counter electrode, and
   a portion of the auxiliary layer that overlaps the first counter electrode in plan view is separated from a portion of the auxiliary layer that overlaps the second counter electrode in plan view.

7. The imaging device according to claim 1, wherein the sealing layer is in contact with the upper surface and end face of the first counter electrode and the upper surface and end face of the second counter electrode.

8. The imaging device according to claim 1, wherein
   the at least one first pixel electrode comprises a plurality of first pixel electrodes, and
   the at least one second pixel electrode comprises a plurality of second pixel electrodes.

9. The imaging device according to claim 8, further comprising:
   a first pixel electrode group including the plurality of first pixel electrodes; and
   a second pixel electrode group including the plurality of second pixel electrodes, wherein
   in the first pixel electrode group, the plurality of first pixel electrodes are arrayed along a first direction,
   in the second pixel electrode group, the plurality of second pixel electrodes are arrayed along the first direction,
   the first pixel electrode group and the second pixel electrode group are arranged along a second direction orthogonal to the first direction,
   the first counter electrode has an elongated shape extending along the first direction and covers the first pixel electrode group, and
   the second counter electrode has an elongated shape extending along the first direction and covers the second pixel electrode group.

10. The imaging device according to claim 9, wherein
    a distance between two first pixel electrodes of the plurality of first pixel electrodes is shorter than a distance between each of the plurality of first pixel electrodes and a corresponding second pixel electrode of the plurality of second pixel electrodes,
    the two first pixel electrodes are adjacent to each other along the first direction, and each of the plurality of first pixel electrodes is adjacent to the corresponding second pixel electrode in the second direction.

11. The imaging device according to claim 9, wherein
in the first pixel electrode group, the plurality of first pixel electrodes are arrayed along the first direction and the second direction, and
in the second pixel electrode group, the plurality of second pixel electrodes are arrayed along the first direction and the second direction.

12. The imaging device according to claim 9, further comprising:
a first electrode terminal to which a first power supply voltage is applied, the first electrode terminal being provided at an end of the first counter electrode on a first side; and
a second electrode terminal to which a second power supply voltage is applied, the second electrode terminal being provided at an end of the second counter electrode on the first side.

13. The imaging device according to claim 9, further comprising:
a first electrode terminal pair to which a first power supply voltage is applied, the first electrode terminal pair being provided at an end of the first counter electrode on a first side;
a second electrode terminal pair to which the first power supply voltage is applied, the second electrode terminal pair being provided at an end of the first counter electrode on a second side opposite to the first side;
a third electrode terminal pair to which a second power supply voltage is applied, the third electrode terminal pair being provided at an end of the second counter electrode on the first side; and
a fourth electrode terminal pair to which the second power supply voltage is applied, the fourth electrode terminal pair being provided at an end of the second counter electrode on the second side.

14. The imaging device according to claim 1, wherein
the photoelectric conversion layer contains an organic compound, and
the sealing layer does not contain the organic compound.

15. The imaging device according to claim 3, wherein a difference between the thickness of the portion of the photoelectric conversion layer in the interelectrode region and the thickness of the portion of the photoelectric conversion layer in the overlap region is equal to or greater than 5 nm.

16. A method for manufacturing an imaging device, the method comprising:
forming a photoelectric conversion layer continuously covering a first pixel electrode and a second pixel electrode spaced from the first pixel electrode;
forming at least one counter electrode covering the photoelectric conversion layer; and
etching, by using a first resist pattern as a mask, portions of the at least one counter electrode and a surface portion of the photoelectric conversion layer located in an interelectrode region between the first pixel electrode and the second pixel electrode in plan view.

17. The method according to claim 16, wherein
the at least one counter electrode comprises a first counter electrode and a second counter electrode spaced from the first counter electrode,
the method further comprises forming a sealing layer continuously covering an upper surface of the first counter electrode and an upper surface of the second counter electrode and containing an oxide of metal or a nitride of metal, and
the sealing layer is in contact with the photoelectric conversion layer in the interelectrode region.

18. The method according to claim 16, wherein
the at least one counter electrode comprises a first counter electrode and a second counter electrode spaced from the first counter electrode,
the method further comprises forming an auxiliary layer located between the photoelectric conversion layer and the first counter electrode and between the photoelectric conversion layer and the second counter electrode, and
the etching includes etching, by using the first resist pattern as a mask, a portion of the auxiliary layer located in the interelectrode region in plan view.

19. The method according to claim 16, wherein
the photoelectric conversion layer contains an organic substance, and
in the forming of the photoelectric conversion layer, the photoelectric conversion layer is formed by a vacuum evaporation method or a method of application.

20. The method according to claim 17, wherein in the forming of the sealing layer, the sealing layer is formed by an atomic layer deposition method.

* * * * *